(12) United States Patent
Lin et al.

(10) Patent No.: US 8,841,171 B2
(45) Date of Patent: Sep. 23, 2014

(54) METHOD OF MAKING STACKABLE SEMICONDUCTOR ASSEMBLY WITH BUMP/FLANGE HEAT SPREADER AND DUAL BUILD-UP CIRCUITRY

(75) Inventors: Charles W. C. Lin, Singapore (SG); Chia-Chung Wang, Judung Jen Hsinchu (TW)

(73) Assignee: Bridge Semiconductor Corporation, Taipei (TW)

( * ) Notice: Subject to any disclaimer, the term of this patent is extended or adjusted under 35 U.S.C. 154(b) by 519 days.

(21) Appl. No.: 13/298,391

(22) Filed: Nov. 17, 2011

(65) Prior Publication Data

US 2012/0129298 A1    May 24, 2012

Related U.S. Application Data

(63) Continuation-in-part of application No. 13/287,374, filed on Nov. 2, 2011.

(60) Provisional application No. 61/415,862, filed on Nov. 22, 2010.

(51) Int. Cl.

| | | |
|---|---|---|
| *H01L 21/00* | (2006.01) | |
| *H01L 23/00* | (2006.01) | |
| *H01L 23/13* | (2006.01) | |
| *H01L 23/367* | (2006.01) | |
| *H01L 25/16* | (2006.01) | |
| *H01L 23/498* | (2006.01) | |
| *H01L 23/538* | (2006.01) | |
| *H01L 25/10* | (2006.01) | |
| *H01L 23/31* | (2006.01) | |

(52) U.S. Cl.
CPC ..... *H01L 23/5389* (2012.01); *H01L 2224/2929* (2013.01); *H01L 24/19* (2013.01); *H01L 23/13* (2013.01); *H01L 2924/01079* (2013.01); *H01L 2225/107* (2013.01); *H01L 2224/82106* (2013.01); *H01L 23/3677* (2013.01); *H01L 24/24* (2013.01); *H01L 2924/014* (2013.01); *H01L 2924/01013* (2013.01); *H01L 2224/29339* (2013.01); *H01L 2224/24101* (2013.01); *H01L 2224/83862* (2013.01); *H01L 2924/01029* (2013.01); *H01L 2924/0104* (2013.01); *H01L 2924/01005* (2013.01); *H01L 2224/2101* (2013.01); *H01L 2224/11849* (2013.01); *H01L 25/16* (2013.01); *H01L 2224/04105* (2013.01); *H01L 24/20* (2013.01); *H01L 2225/1058* (2013.01); *H01L 2224/12105* (2013.01); *H01L 2924/01006* (2013.01); *H01L 2924/01082* (2013.01); *H01L 24/82* (2013.01); *H01L 2924/01012* (2013.01); *H01L 2924/01087* (2013.01); *H01L 2224/131* (2013.01); *H01L 2224/1146* (2013.01); *H01L 23/3121* (2013.01); *H01L 2924/01033* (2013.01); *H01L 2924/3511* (2013.01); *H01L 2224/24221* (2013.01); *H01L 23/49827* (2013.01); *H01L 2224/221* (2013.01); *H01L 2224/1132* (2013.01); *H01L 2225/1035* (2013.01); *H01L 2924/01047* (2013.01); *H01L 2224/73267* (2013.01); *H01L 2224/92244* (2013.01); *H01L 2224/83192* (2013.01); *H01L 2924/01074* (2013.01); *H01L 2224/16225* (2013.01); *H01L 2924/0001* (2013.01); *H01L 2224/215* (2013.01); *H01L 2225/1052* (2013.01); *H01L 25/105* (2013.01)
USPC ............................ 438/118; 438/122; 438/123

(58) Field of Classification Search
CPC .............. H01L 23/367; H01L 23/3677; H01L 21/4871; H01L 23/13; H01L 23/3121; H01L 23/5389; H01L 23/49827; H01L 24/19; H01L 24/20; H01L 24/24; H01L 24/82; H01L 25/16; H01L 25/105; H01L 2224/02122; H01L 2224/02123; H01L 2224/0214; H01L 2224/0218; H01L 2225/107; H01L 2225/108; H01L 2225/1035; H01L 2225/1052; H01L 2924/0001; H01L 2924/014
USPC ......... 257/678, 685, 686, 687, 690, 700, 712, 257/720; 438/106, 118, 121, 122, 123
See application file for complete search history.

(56) References Cited

U.S. PATENT DOCUMENTS

| | | | |
|---|---|---|---|
| 5,111,278 | A | 5/1992 | Eichelberger |
| 5,432,677 | A | 7/1995 | Mowatt et al. |
| 5,565,706 | A | 10/1996 | Miura et al. |
| 6,506,632 | B1 | 1/2003 | Cheng et al. |
| 6,506,633 | B1 | 1/2003 | Cheng et al. |
| 6,680,529 | B2 | 1/2004 | Chen et al. |
| 7,242,092 | B2 | 7/2007 | Hsu |
| 7,321,164 | B2 | 1/2008 | Hsu |
| 7,507,915 | B2 | 3/2009 | Chang et al. |
| 7,511,359 | B2 | 3/2009 | Tang et al. |
| 7,514,770 | B2 | 4/2009 | Chang et al. |
| 7,579,690 | B2 | 8/2009 | Chia |
| 7,618,846 | B1 | 11/2009 | Pagaila et al. |

| | | |
|---|---|---|
| 7,639,473 B2 | 12/2009 | Hsu et al. |
| 7,656,015 B2 | 2/2010 | Wong et al. |
| 7,656,040 B2 | 2/2010 | Hsu et al. |
| 7,659,143 B2 | 2/2010 | Tang et al. |
| 7,674,986 B2 | 3/2010 | Chang et al. |
| 7,706,148 B2 | 4/2010 | Hsu et al. |
| 7,777,328 B2 | 8/2010 | Enomoto |
| 7,781,877 B2 | 8/2010 | Jiang et al. |
| 7,799,602 B2 | 9/2010 | Pagaila et al. |
| 7,842,887 B2 | 11/2010 | Sakamoto et al. |
| 7,880,275 B2 | 2/2011 | Pagaila et al. |
| 7,881,069 B2 | 2/2011 | Inagaki et al. |
| 7,884,461 B2 | 2/2011 | Hu et al. |
| 7,888,184 B2 | 2/2011 | Shim et al. |
| 7,894,203 B2 | 2/2011 | Kariya et al. |
| 7,935,893 B2 | 5/2011 | Tanaka et al. |
| 7,957,154 B2 | 6/2011 | Ito et al. |
| 2008/0277150 A1 | 11/2008 | Takashima et al. |

*Primary Examiner* — Colleen A Matthews
*Assistant Examiner* — Quovaunda V Jefferson
(74) *Attorney, Agent, or Firm* — Bacon & Thomas, PLLC

(57) ABSTRACT

A method of making a stackable semiconductor assembly that includes a semiconductor device, a heat spreader, an adhesive, a plated through-hole, first build-up circuitry and second build-up circuitry is disclosed. The heat spreader includes a bump and a flange. The bump defines a cavity. The semiconductor device is mounted on the bump at the cavity, electrically connected to the first build-up circuitry and thermally connected to the bump. The bump extends into an opening in the adhesive and the flange extends laterally from the bump at the cavity entrance. The first build-up circuitry and the second build-up circuitry extend beyond the semiconductor device in opposite vertical directions. The plated through-hole extends through the adhesive and provides signal routing between the first build-up circuitry and the second build-up circuitry. The heat spreader provides heat dissipation for the semiconductor device.

44 Claims, 12 Drawing Sheets

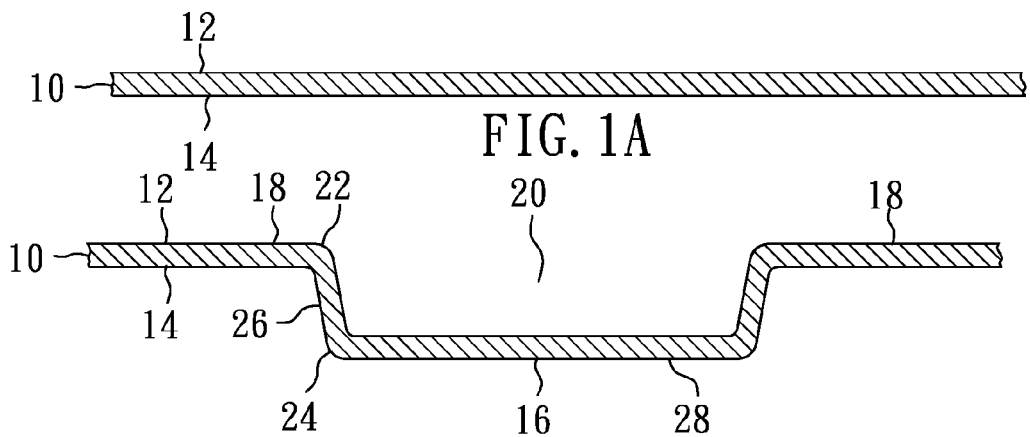
FIG. 1A
FIG. 1B
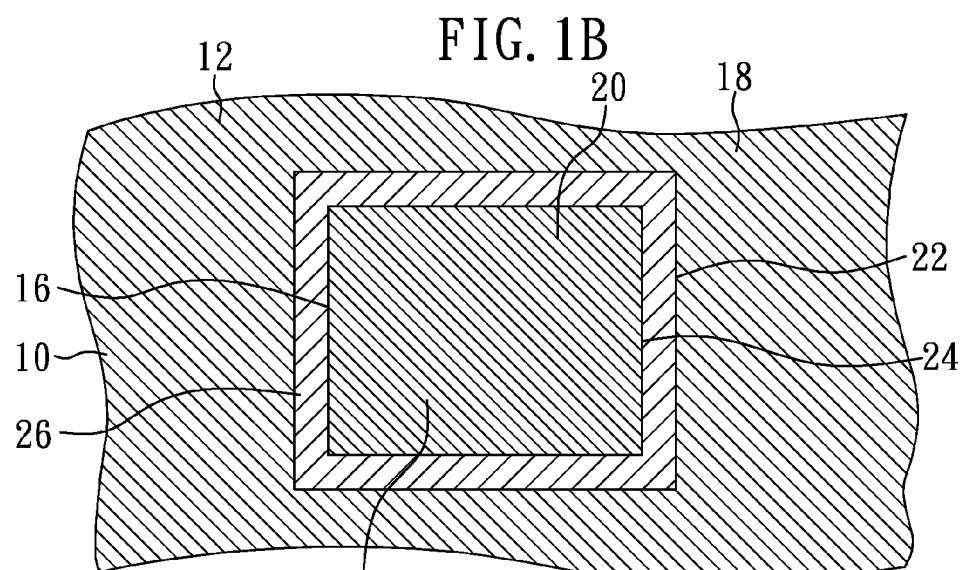
FIG. 1C
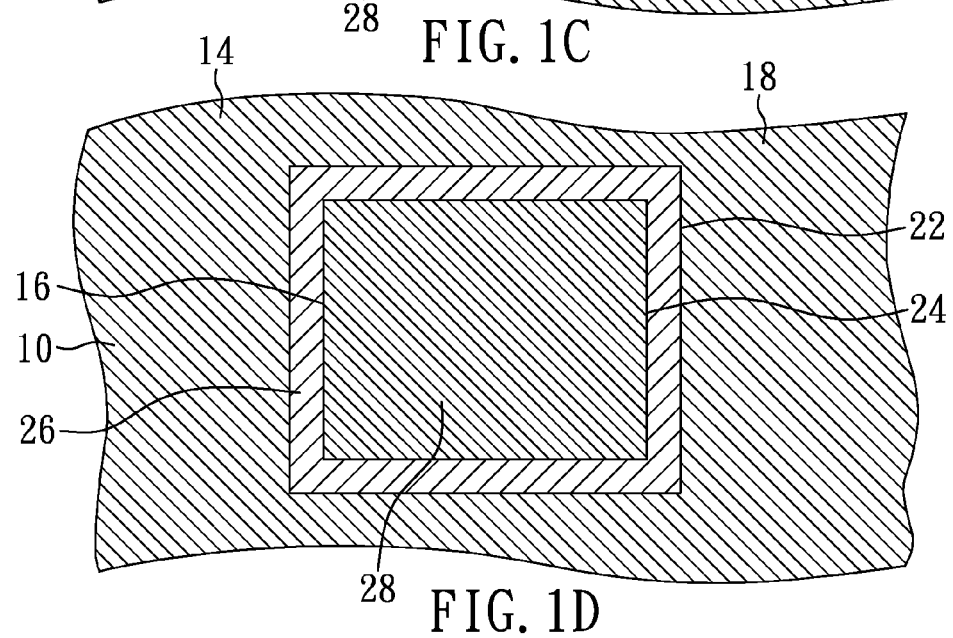
FIG. 1D

METHOD OF MAKING STACKABLE SEMICONDUCTOR ASSEMBLY WITH BUMP/FLANGE HEAT SPREADER AND DUAL BUILD-UP CIRCUITRY

CROSS REFERENCE TO RELATED APPLICATION

This application is a continuation-in-part of U.S. application Ser. No. 13/287,374, entitled "STACKABLE SEMICONDUCTOR ASSEMBLY WITH BUMP/FLANGE HEAT SPREADER AND DUAL BUILD-UP CIRCUITRY" filed Nov. 2, 2011. This application also claims the benefit of filing date of U.S. Provisional Application Ser. No. 61/415,862, entitled "SEMICONDUCTOR CHIP ASSEMBLY WITH BUMP/BASE HEAT SPREADER, CAVITY IN BUMP AND EXTENDED CONDUCTIVE TRACE" filed Nov. 22, 2010 under 35 USC §119(e)(1).

BACKGROUND OF THE INVENTION

1. Field of the Invention

The present invention relates to a method of making a semiconductor assembly, and more particularly to a method of making a stackable semiconductor assembly that includes a semiconductor device, a heat spreader, an adhesive, a plated through-hole and dual build-up circuitry.

2. Description of Related Art

In the field of electronic systems, there is a continuous need to improve performance and reduce size and weight. Many approaches have been proposed to meet these requirements and strike a balance between performance optimization, time-to-market expedition and cost reduction through the use of different architectures, materials, equipment, process nodes, and manufacturing methods. Among all efforts, technical innovations at packaging-level are considered the most cost effective and least time consuming. Furthermore, as there are significant obstacles to further reduce chip feature sizes below the nanometer range due to significant expense for material, equipment and process developments, attention has therefore shifted to packaging technologies to timely fulfill the relentless demands for a smarter and smaller device.

Plastic packages such as ball grid array (BGA) or QFN (Quad Flat No-Lead) commonly contain one chip per package. In order to accommodate more functions and minimize signal delay, stacking multiple chips in a package to reduce the length of interconnection and maintain minimal footprint has become promising. For instance, stacking a mobile-processor die with a separate memory chip can enhance device speed, footprint, and power consumption. Furthermore, stacking multiple chips in a module allows accommodating different function chips including logic, memory, analog, RF, integrated passive component (IPC) and micro-electrical mechanical systems (MEMS) at different process nodes, such as 28 nm for high-speed logic and 130 nm for analog.

Despite numerous three-dimensional packaging architectures reported in the literature, many performance-related deficiencies remain. For instance, multiple devices stacked in a limited space often encounter undesirable inter-device noise such as electromagnetic interference (EMI). The signal integrity of the stacked devices can be adversely affected when they perform high frequency transmitting or receiving of signals. Furthermore, as semiconductor devices are susceptible to performance degradation and immediate failure at high operating temperatures, collective heat generated from the chips enclosed in a thermally insulating material such as dielectrics can cause catastrophic damage to the assembly. As such, providing a stackable semiconductor assembly that can resolve electromagnetic interference, facilitate heat dissipation yet maintain low cost in manufacturing would be highly desirable.

U.S. Pat. No. 5,111,278 to Eichelberger discloses a multi-chip module that is three dimensional stackable. In this approach, semiconductor chips are disposed on a flat substrate and sealed by an encapsulant with via openings formed on the connection pads. A pattern of conductors disposed on the encapsulant extend to the exposed bonding pads and thus interconnect these semiconductor chips from the upper surface of the module. Plated through-holes are deployed in the module to connect upper and lower circuitries and thus establish the three-dimensional stacking for the embedded chips. However, as most plastic material has low thermal conductivity, this plastic assembly suffers poor thermal performance and offers no electromagnetic shielding protection for the embedded chips.

U.S. Pat. No. 5,432,677 to Mowatt et. al., U.S. Pat. No. 5,565,706 to Miura et al., U.S. Pat. No. 6,680,529 to Chen et al. and U.S. Pat. No. 7,842,887 to Sakamoto et al. disclose various embedded modules to address manufacturing yield and reliability concerns. None of these approaches offers a proper thermal dissipation solution or effective electromagnetic protection for the embedded chips.

U.S. Pat. No. 7,242,092 to Hsu and U.S. Pat. No. 7,656,015 to Wong disclose an assembly in which the semiconductor chip is housed in a cavity with a bottom metal layer in the cavity to facilitate heat dissipation for the embedded chip. Since the cavity in the substrate is formed by laser or plasma etching of the substrate, the major drawbacks include low throughput and high cost in forming the cavity in addition to the limited heat dissipation capability of the bottom metal layer in the structure.

U.S. Pat. No. 7,777,328 to Enomoto discloses a thermally enhanced assembly in which a cavity for the die placement is formed by micro-machining or by milling out a portion of a metal. Inconsistent cavity depth control of the recess in the metal plate can result in low throughput and low yield in volume production. Furthermore, as the thick metal plate would electrically block the vertical connection to the bottom surface, resin filled holes need to be created before metallized plated through-holes can be built in the metal block. The cumbersome process makes the manufacturing yield excessive low and costly.

U.S. Pat. No. 7,957,154 to Ito et al. discloses an assembly in which a metal layer is formed on the inner wall surface of a cavity so that the embedded semiconductor chip can be protected from electromagnetic interference. Like many other cavity type approaches, this assembly suffers poor manufacturing throughput and low yield due to inconsistent cavity formation in the resin. Furthermore, since the metal is deposited in the cavity by electroplating, it has limited thickness and does little to improve the package's thermal performance.

In view of the various development stages and limitations in currently available packages for high power and high performance semiconductor devices, there is a need for a stackable semiconductor assembly that is cost effective, reliable, manufacturable, versatile, provides good signal integrity and has excellent heat spreading and dissipation.

SUMMARY OF THE INVENTION

The present invention provides a method of making a stackable semiconductor assembly that includes a semiconductor device, a heat spreader, an adhesive, a plated through-hole, first build-up circuitry and second build-up circuitry. The method of making a stackable semiconductor assembly can include: providing a bump, a flange, an adhesive and a conductive layer with an aperture, wherein the bump defines a cavity that faces in a first vertical direction, covers the cavity in a second vertical direction opposite the first vertical direction, is adjacent to and integral with the flange and extends from the flange in the second vertical direction, and the flange extends laterally from the bump in lateral directions orthogonal to the vertical directions; then attaching the flange and the bump to the conductive layer via the adhesive between the flange and the conductive layer and between the bump and the conductive layer, including aligning the bump with the aperture; then mounting a semiconductor device that includes one or more contact pads on the bump at the cavity; providing a first build-up circuitry on the semiconductor device and the flange that extends from the semiconductor device and the flange in the first vertical direction and is electrically connected to the semiconductor device; providing a second build-up circuitry that extends beyond the bump, the adhesive and the conductive layer in the second vertical direction; and providing a plated through-hole that extends through the adhesive in the vertical directions to provide an electrical connection between the first build-up circuitry and the second build-up circuitry.

Attaching the flange and the bump to the conductive layer can include: mounting the adhesive that is non-solidified between the flange and the conductive layer, including aligning the bump with an opening of the adhesive and the aperture of the conductive layer; and flowing the adhesive into a gap located in the aperture between the bump and the conductive layer; and solidifying the adhesive.

Mounting the adhesive between the flange and the conductive layer can include: mounting the adhesive on the flange, including aligning the bump with the opening of the adhesive; and mounting the conductive layer on the adhesive, including aligning the bump with the aperture of the conductive layer.

Mounting the conductive layer on the adhesive can include mounting the conductive layer alone on the adhesive such that the conductive layer contacts the adhesive and the aperture extends through the conductive layer alone. Alternatively, mounting the conductive layer on the adhesive can include mounting a laminated structure that includes the conductive layer and a substrate on the adhesive such that the substrate contacts and is sandwiched between the conductive layer and the adhesive, the conductive layer is spaced from the adhesive and the aperture extends through the conductive layer and the substrate. As another alternative, mounting the conductive layer on the adhesive can include mounting the conductive layer and a carrier on the adhesive such that the conductive layer contacts and is sandwiched between the adhesive and the carrier, and then, after solidifying the adhesive, removing the carrier.

The present invention also provides a method of making a stackable semiconductor assembly that further includes a substrate. The method of making a stackable semiconductor assembly can include: providing a bump, a flange, an adhesive and a substrate with an aperture, wherein the bump defines a cavity that faces in a first vertical direction, covers the cavity in a second vertical direction opposite the first vertical direction, is adjacent to and integral with the flange and extends from the flange in the second vertical direction, and the flange extends laterally from the bump in lateral directions orthogonal to the vertical directions; then attaching the flange and the bump to the substrate via the adhesive between the flange and the substrate and between the bump and the substrate, including aligning the bump with the aperture; then mounting a semiconductor device that includes one or more contact pads on the bump at the cavity; providing a first build-up circuitry on the semiconductor device and the flange that extends from the semiconductor device and the flange in the first vertical direction and is electrically connected to the semiconductor device; providing a second build-up circuitry that extends beyond the bump, the adhesive and the substrate in the second vertical direction; and providing a plated through-hole that extends through the adhesive and the substrate in the vertical directions to provide an electrical connection between the first build-up circuitry and the second build-up circuitry.

Attaching the flange and the bump to the substrate can include: mounting the adhesive that is non-solidified between the flange and the substrate, including aligning the bump with an opening of the adhesive and the aperture of the substrate; flowing the adhesive into a gap located in the aperture between the bump and the substrate; and solidifying the adhesive.

Mounting the adhesive between the flange and the substrate can include: mounting the adhesive on the flange, including aligning the bump with the opening of the adhesive; and mounting the substrate on the adhesive, including aligning the bump with the aperture of the substrate.

Mounting the substrate on the adhesive can include mounting a laminated structure that includes the substrate and a conductive layer on the adhesive such that the substrate contacts and is sandwiched between the conductive layer and the adhesive, the conductive layer is spaced from the adhesive and the aperture extends through the conductive layer and the substrate.

Flowing the adhesive into the gap can include: applying heat to melt the adhesive; and moving the flange and the substrate (or the conductive layer) towards one another, thereby moving the bump in the second vertical direction in the aperture and applying pressure to the molten adhesive between the flange and the substrate (or the conductive layer), wherein the pressure forces the molten adhesive to flow in the second vertical direction into the gap located in the aperture between the bump and the substrate (or the conductive layer).

Solidifying the adhesive can include applying heat to solidify the molten adhesive, thereby mechanically attaching the bump and the flange to the substrate (or the conductive layer).

The first build-up circuitry can include a first dielectric layer and one or more first conductive traces, while the second build-up circuitry can include a second dielectric layer and one or more second conductive traces. As a result, providing the first build-up circuitry and the second build-up circuitry can include: providing a first dielectric layer on the semiconductor device and the flange that extends from the semiconductor device and the flange in the first vertical direction and includes one or more first via openings that are aligned with the contact pad and optionally aligned with the flange; providing a second dielectric layer that extends beyond the bump, the adhesive and the conductive layer in the second vertical direction and optionally includes one or more second via openings that are aligned with the bump; providing one or more first conductive traces on the first dielectric layer that extend from the first dielectric layer in the first vertical direction, extend laterally on the first dielectric layer and extend through the first via openings in the second vertical direction to the contact pad and optionally to the flange, thereby electrically connecting the semiconductor device and optionally the flange to the first conductive traces; and providing one or more second conductive trace on the second dielectric layer that extend from the second dielectric layer in the second vertical direction, extend laterally on the second dielectric layer and extend through the second via openings in the first vertical direction, thereby electrically connecting the bump to the second conductive traces.

The first build-up circuitry and the second build-up circuitry can include additional layers of dielectric, additional layers of via openings, and additional layers of conductive traces if needed for further signal routing. For instance, the first build-up circuitry can further include a third dielectric layer, one or more third via openings and one or more third conductive traces. As a result, providing the first build-up circuitry can further include: depositing a third dielectric layer on the first dielectric layer and the first conductive traces that extends from the first dielectric layer and the first conductive traces in the first vertical direction and is spaced from the semiconductor device, the flange and the cavity; then forming one or more third via openings that extend through the third dielectric layer and are aligned with and expose the first conductive traces; and then forming one or more third conductive traces that extend from the third dielectric layer in the first vertical direction and extend laterally on the third dielectric layer and extend through the third via openings in the second vertical direction to the first conductive traces, thereby electrically connecting the first conductive traces to the third conductive traces. Likewise, the second build-up circuitry can further include a fourth dielectric layer, one or more fourth via openings and one or more fourth conductive traces. As a result, providing the second build-up circuitry can further include: depositing a fourth dielectric layer on the second dielectric layer and the second conductive traces that extends from the second dielectric layer and the second conductive traces in the second vertical direction; then forming one or more fourth via openings that extend through the fourth dielectric layer and are aligned with and expose the second conductive traces; and then forming one or more fourth conductive traces that extend from the fourth dielectric layer in the second vertical direction and extend laterally on the fourth dielectric layer and extend through the fourth via openings in the first vertical direction to the second conductive traces, thereby electrically connecting the second conductive traces to the fourth conductive traces.

The first build-up circuitry may extend within and outside the cavity. For instance, the first dielectric layer of the first build-up circuitry can extend into and fills the remaining space in the cavity. Alternatively, the first build-up circuitry can be spaced from and extend outside the cavity. For instance, the cavity may be filled with a die attach so that the first dielectric layer does not extend into the cavity and is spaced from the cavity.

In accordance with one aspect of the present invention, the method of making a stackable semiconductor assembly includes: providing a bump, a flange, an adhesive and a conductive layer, wherein (i) the bump defines a cavity that faces in a first vertical direction, covers the cavity in a second vertical direction opposite the first vertical direction, is adjacent to and integral with the flange, extends vertically from the flange in the second vertical direction, extends into an opening in the adhesive and is aligned with a aperture in the conductive layer, (ii) the flange extends laterally from the bump in lateral directions orthogonal to the vertical directions, (iii) the adhesive is sandwiched between the flange and the conductive layer and is non-solidified, and (iv) the conductive layer is mounted on the adhesive; then flowing the adhesive into a gap located in the aperture between the bump and the conductive layer; solidifying the adhesive; then mounting a semiconductor device that includes one or more contact pads on the bump, thereby mechanically attaching and thermally connecting the semiconductor device to the bump; providing a first dielectric layer on the semiconductor device and the flange that extends from the semiconductor device and the flange in the first vertical direction and includes one or more first via openings that are aligned with and expose the contact pads and optionally the flange; providing a second dielectric layer that extends beyond the bump, the adhesive and the conductive layer in the second vertical direction and optionally includes one or more second via openings that are aligned with the bump; providing one or more first conductive traces on the first dielectric layer that extend from the first dielectric layer in the first vertical direction, extend laterally on the first dielectric layer and extend through the first via openings in the second vertical direction to the contact pads and optionally to the flange, thereby electrically connecting the semiconductor device and optionally the flange to the first conductive traces; providing one or more second conductive traces on the second dielectric layer that extend from the second dielectric layer in the second vertical direction, extend laterally on the second dielectric layer and extend through the second via openings in the first vertical direction, thereby electrically connecting the bump to the second conductive traces; and providing a plated through-hole that extends through the adhesive in the vertical directions to provide an electrical connection between the first conductive trace and the second conductive trace.

In accordance with another aspect of the present invention, the method of making a stackable semiconductor assembly includes: providing a bump and a flange, wherein the bump defines a cavity that faces in a first vertical direction, is adjacent to and integral with the flange and extends vertically from the flange in a second vertical direction opposite the first vertical direction, the flange extends laterally from the bump in lateral directions orthogonal to the vertical directions and the cavity is covered by the bump in the second vertical direction; providing an adhesive, wherein an opening extends through the adhesive; providing a conductive layer, wherein an aperture extends through the conductive layer; mounting the adhesive on the flange, including inserting the bump into the opening; mounting the conductive layer on the adhesive, including aligning the bump with the aperture, wherein the adhesive is sandwiched between the flange and the conductive layer and is non-solidified; then applying heat to melt the adhesive; moving the flange and the conductive layer towards one another, thereby moving the bump in the second vertical direction in the aperture and applying pressure to the molten adhesive between the flange and the conductive layer, wherein the pressure forces the molten adhesive to flow in the second vertical direction into a gap located in the aperture between the bump and the conductive layer; applying heat to solidify the molten adhesive, thereby mechanically attaching the bump and the flange to the conductive layer; then mounting a semiconductor device that includes one or more contact pads on the bump, thereby mechanically attaching and thermally connecting the semiconductor device to the bump, wherein the semiconductor device extends into the cavity; providing a first dielectric layer on the semiconductor device and the flange that extends from the semiconductor device and the flange in the first vertical direction and includes one or more first via openings that are aligned with and expose the contact pads and optionally the flange; providing a second dielectric layer that extends beyond the bump, the adhesive and the conductive layer in the second vertical direction and optionally includes one or more second via openings that are aligned with the bump; providing one or more first conductive traces on the first dielectric layer that extend from the first dielectric layer in the first vertical direction, extend laterally on the first dielectric layer and extend through the first via openings in the second vertical direction to the contact pads and optionally to the flange, thereby electrically connecting the semiconductor device and optionally the flange to the first conductive traces; providing one or more second conductive traces on the second dielectric layer that extend from the second dielectric layer in the second vertical direction, extend laterally on the second dielectric layer and extend through the second via openings in the first vertical direction, thereby electrically connecting the bump to the second conductive traces; and providing a plated through-hole that extends through the adhesive in the vertical directions to provide an electrical connection between the first conductive trace and the second conductive trace.

In accordance with yet another aspect of the present invention, the method of making a stackable semiconductor assembly includes: providing a bump, a flange, an adhesive and a laminated structure that includes a conductive layer and a substrate, wherein (i) the bump defines a cavity that faces in a first vertical direction, covers the cavity in a second vertical direction opposite the first vertical direction, is adjacent to and integral with the flange, extends vertically from the flange in the second vertical direction, extends into an opening in the adhesive and is aligned with a aperture in the laminated structure, (ii) the flange extends laterally from the bump in lateral directions orthogonal to the vertical directions, (iii) the adhesive is sandwiched between the flange and the laminated structure and is non-solidified, and (iv) the laminated structure is mounted on the adhesive such that the substrate is sandwiched between the adhesive and the conductive layer; then flowing the adhesive into a gap located in the aperture between the bump and the laminated structure; solidifying the adhesive; then mounting a semiconductor device that includes one or more contact pads on the bump, thereby mechanically attaching and thermally connecting the semiconductor device to the bump; providing a first dielectric layer on the semiconductor device and the flange that extends from the semiconductor device and the flange in the first vertical direction and includes one or more first via openings that are aligned with and expose the contact pads and optionally the flange; providing a second dielectric layer that extends beyond the bump, the adhesive and the conductive layer in the second vertical direction and optionally includes one or more second via openings that are aligned with the bump; providing one or more first conductive traces on the first dielectric layer that extend from the first dielectric layer in the first vertical direction, extend laterally on the first dielectric layer and extend through the first via openings in the second vertical direction to the contact pads and optionally to the flange, thereby electrically connecting the semiconductor device and optionally the flange to the first conductive traces; providing one or more second conductive traces on the second dielectric layer that extend from the second dielectric layer in the second vertical direction, extend laterally on the second dielectric layer and extend through the second via openings in the first vertical direction, thereby electrically connecting the bump to the second conductive traces; and providing a plated through-hole that extends through the adhesive and the substrate in the vertical directions to provide an electrical connection between the first conductive trace and the second conductive trace.

In accordance with still another aspect of the present invention, the method of making a stackable semiconductor assembly includes: providing a bump and a flange, wherein the bump defines a cavity that faces in a first vertical direction, is adjacent to and integral with the flange and extends vertically from the flange in a second vertical direction opposite the first vertical direction, the flange extends laterally from the bump in lateral directions orthogonal to the vertical directions and the cavity is covered by the bump in the second vertical direction; providing an adhesive, wherein an opening extends through the adhesive; providing a laminated structure that includes a conductive layer and a substrate, wherein an aperture extends through the conductive layer and the substrate; mounting the adhesive on the flange, including inserting the bump into the opening; mounting the laminated structure on the adhesive, including aligning the bump with the aperture, wherein the adhesive is sandwiched between the flange and the laminated structure and is non-solidified and the substrate is sandwiched between the adhesive and the conductive layer; then applying heat to melt the adhesive; moving the flange and the laminated structure towards one another, thereby moving the bump in the second vertical direction in the aperture and applying pressure to the molten adhesive between the flange and the laminated structure, wherein the pressure forces the molten adhesive to flow in the second vertical direction into a gap located in the aperture between the bump and the laminated structure; applying heat to solidify the molten adhesive, thereby mechanically attaching the bump and the flange to the conductive layer and the substrate; then mounting a semiconductor device that includes one or more contact pads on the bump, thereby mechanically attaching and thermally connecting the semiconductor device to the bump, wherein the semiconductor device extends into the cavity; providing a first dielectric layer on the semiconductor device and the flange that extends from the semiconductor device and the flange in the first vertical direction and includes one or more first via openings that are aligned with and expose the contact pads and optionally the flange; providing a second dielectric layer that extends beyond the bump, the adhesive and the conductive layer in the second vertical direction and optionally includes one or more second via openings that are aligned with the bump; providing one or more first conductive traces on the first dielectric layer that extend from the first dielectric layer in the first vertical direction, extend laterally on the first dielectric layer and extend through the first via openings in the second vertical direction to the contact pads and optionally to the flange, thereby electrically connecting the semiconductor device and optionally the flange to the first conductive traces; providing one or more second conductive traces on the second dielectric layer that extend from the second dielectric layer in the second vertical direction, extend laterally on the second dielectric layer and extend through the second via openings in the first vertical direction, thereby electrically connecting the bump to the second conductive traces; and providing a plated through-hole that extends through the adhesive and the substrate in the vertical directions to provide an electrical connection between the first conductive trace and the second conductive trace.

Mounting the semiconductor device can include mechanically attaching and thermally connecting the semiconductor device to the bump using a die attach that is located within the cavity.

Providing the first conductive trace and the second conductive trace can include: depositing a first plated layer on the first dielectric layer that extends through the first via opening to the contact pad and optionally to the flange; depositing a second plated layer on the second dielectric layer that extends through the second via opening; removing selected portions of the first plated layer to define the first conductive trace; and removing selected portions of the second plated layer to define the second conductive trace.

Providing the plated through-hole can include forming a through-hole that extends through the adhesive and the substrate if present in the vertical directions, and then depositing a connecting layer on an inner sidewall of the through-hole.

The plated through-hole can be provided during providing the first build-up circuitry and the second build-up circuitry or before mounting the semiconductor device and after attaching the flange and the bump to the conductive layer or the substrate. For instance, providing the plated through-hole can include forming a through-hole that extends through the dielectric layers (e.g. extends through the first and second dielectric layers, or extends through the first, second, third and fourth dielectric layers), the adhesive and the substrate in the vertical directions after providing the dielectric layers (e.g. the first dielectric layer/the second dielectric layer or the third dielectric layer/the fourth dielectric layer) and then depositing a connecting layer on an inner sidewall of the through-hole during depositing the conductive traces (e.g. the first conductive trace/the second conductive trace or the third conductive trace/the fourth conductive trace). Alternatively, providing the plated through-hole can include forming a through-hole that extends through the flange, the adhesive, the substrate and the conductive layer in the vertical directions and then depositing a connecting layer on an inner sidewall of the through-hole before mounting the semiconductor device and after solidifying the adhesive.

Providing the first dielectric layer, the second dielectric layer, the first conductive trace, the second conductive trace and the plated through-hole can include: forming a through-hole that extends through the adhesive and the substrate (if present) in the vertical directions; then depositing a connecting layer on an inner sidewall of the through-hole; depositing an inner plated layer on the bump and flange in the first vertical direction and on the bump, the adhesive and the conductive layer in the second vertical direction; then removing selected portions of the flange and the inner plated layer in the first vertical direction to define a first inner pad such that the first inner pad is adjacent to the connecting layer and spaced from the flange; removing selected portions of the conductive layer and the inner plated layer in the second vertical direction to define a base and a second inner pad wherein (i) the base is adjacent to the bump, extends from and covers the bump in the second vertical direction and extends laterally from the bump, includes a selected portion of the conductive layer that is adjacent to the aperture and spaced from the bump and includes a selected portion of the inner plated layer that is adjacent to the bump, the adhesive and the conductive layer, and (ii) the second inner pad is adjacent to the connecting layer and spaced from the bump and the base, extends beyond the adhesive or extends from the substrate in the second vertical direction, includes a selected portion of the conductive layer that is spaced from the aperture and the bump and includes a selected portion of the inner plated layer that is adjacent to the conductive layer and spaced from the bump and the adhesive; then depositing the first dielectric layer on the semiconductor device, the flange and the first inner pad; depositing the second dielectric layer on the base and the second inner pad; then forming the first via opening and an additional first via opening in the first dielectric layer, wherein the additional first via opening is aligned with and exposes the first inner pad; forming one or more second via openings in the second dielectric layer that are aligned with and exposes the second inner pad and optionally aligned with the base; then depositing a first plated layer on the first dielectric layer that extends through the first via opening to the contact pad and optionally to the flange and extends through the additional first via opening to the first inner pad; depositing a second plated layer on the second dielectric layer that extends through the second via openings to the second inner pad and optionally to the base; then removing selected portions of the first plated layer to define the first conductive trace; and removing selected portions of the second plated layer to define the second conductive trace. Alternatively, providing the first dielectric layer, the second dielectric layer, the first conductive trace, the second conductive trace and the plated through-hole can include: depositing the first dielectric layer on the semiconductor device and the flange; depositing the second dielectric layer on the bump, the adhesive and the conductive layer; then forming the first via opening in the first dielectric layer; optionally forming one or more second via openings in the second dielectric layer that are aligned with the bump; depositing a first plated layer on the first dielectric layer that extends through the first via opening to the contact pad and optionally to the flange; depositing a second plated layer on the second dielectric layer that extends through the second via opening to the bump; removing selected portions of the first plated layer to define the first conductive trace; removing selected portions of the second plated layer to define the second conductive trace; forming a through-hole that extends through the adhesive, the substrate (if present), the first dielectric layer and the second dielectric layer in the vertical directions; and depositing a connecting layer on an inner sidewall of the through-hole to provide an electrical connection between the first conductive trace and the second conductive trace.

Removing selected portions of the first plated layer can include forming an etch mask on the first plated layer that defines the first conductive trace; then etching the first plated layer in a pattern defined by the etch mask; and then removing the etch mask. Likewise, removing selected portions of the second plated layer can include forming an etch mask on the second plated layer that defines the second conductive trace; then etching the second plated layer in a pattern defined by the etch mask; and then removing the etch mask.

The method of the present invention can include grinding the bump, the adhesive and the conductive layer such that the bump, the adhesive and the conductive layer are laterally aligned with one another at a lateral surface that faces in the second vertical direction after solidifying the adhesive and before depositing the plated layer. The grinding can include grinding the adhesive without grinding the bump and then grinding the bump, the adhesive and the conductive layer.

In a preferred embodiment, the method of making a stackable semiconductor assembly includes: providing a bump, a flange, an adhesive and a laminated structure, wherein (i) the bump defines a cavity that faces in a first vertical direction, is adjacent to and integral with the flange and extends vertically from the flange in a second vertical direction opposite the first vertical direction and the cavity is covered by the bump in the second vertical direction, (ii) the flange extends laterally from the bump in lateral directions orthogonal to the vertical directions, (iii) the adhesive includes an opening that extends through the adhesive, and (iv) the laminated structure includes a conductive layer and a substrate, and an aperture extends through the laminated structure; mounting the adhesive on the flange, including inserting the bump into the opening; mounting the laminated structure on the adhesive, including inserting the bump into the aperture, wherein the substrate contacts and is sandwiched between the conductive layer and the adhesive, the conductive layer is spaced from the adhesive and the adhesive contacts and is sandwiched between the flange and the substrate and is non-solidified; then applying heat to melt the adhesive; moving the flange and the laminated structure towards one another, thereby moving the bump in the second vertical direction in the aperture and applying pressure to the molten adhesive between the flange and the laminated structure, wherein the pressure forces the molten adhesive to flow in the second vertical direction into a gap located in the aperture between the bump and the laminated structure; applying heat to solidify the molten adhesive, thereby mechanically attaching the bump and the flange to the conductive layer and the substrate; then grinding the bump, the adhesive and the conductive layer such that the bump, the adhesive and the conductive layer are laterally aligned with one another at a lateral surface that faces in the second vertical direction; then mounting a semiconductor device that includes one or more contact pads on the bump using a die attach, thereby mechanically attaching and thermally connecting the semiconductor device to the bump, wherein the semiconductor device extends into the cavity and the bump provides a recessed die paddle for the semiconductor device; then depositing a first dielectric layer on the semiconductor device and the flange that extends from the semiconductor device and the flange in the first vertical direction and extends into and fills the remaining space in the cavity; depositing a second dielectric layer on the bump, the adhesive and the conductive layer that extends from the bump, the adhesive and the conductive layer in the second vertical direction; then forming one or more first via openings that extend through the first dielectric layer and are aligned with and expose the contact pad and optionally the flange; optionally forming one or more second via openings that extend through the second dielectric layer and are aligned with and expose the bump; depositing a first plated layer on the first dielectric layer and removing selected portions of the first plated layer in a pattern defined by a first etch mask, wherein one or more first conductive traces include a selected portion of the first plated layer that extends from the first dielectric layer in the first vertical direction and extends laterally on the first dielectric layer and extends through the first via openings in the second vertical direction to the contact pad and optionally to the flange, thereby electrically connecting the semiconductor device and optionally the flange to the first conductive traces; depositing a second plated layer on the second dielectric layer and removing selected portions of the second plated layer in a pattern defined by a second etch mask, wherein one or more second conductive traces include a selected portion of the second plated layer that extends from the second dielectric layer in the second vertical direction and extends laterally on the second dielectric layer and extends through the second via openings in the first vertical direction to the bump, thereby electrically connecting the bump to the second conductive traces; providing a first build-up circuitry that includes the first dielectric layer and the first conductive traces and a second build-up circuitry that includes the second dielectric layer and the second conductive traces, wherein the semiconductor device can be thermally connected to outer conductive traces of the first or/and second build-up circuitry by the flange or/and the bump; forming a through-hole that extends through the adhesive, the substrate, the first dielectric layer and the second dielectric layer in the vertical directions; and depositing a connecting layer on an inner sidewall of the through-hole, wherein a plated through-hole includes the through-hole and the connecting layer that provides an electrical connection between the first conductive trace and the second conductive trace.

In accordance with the above-mentioned aspects and preferred embodiment, the method can further include: depositing a third dielectric layer on the first dielectric layer and the first conductive trace that extends from the first dielectric layer and the first conductive trace in the first vertical direction and is spaced from the semiconductor device, the flange and the cavity; then forming one or more third via openings that extend through the third dielectric layer and are aligned with and expose the first conductive trace; and then forming one or more third conductive traces that extend from the third dielectric layer in the first vertical direction and extend laterally on the third dielectric layer and extend through the third via openings in the second vertical direction to the first conductive trace, thereby electrically connecting the first conductive trace to the third conductive trace. Also, the method can further include: depositing a fourth dielectric layer on the second dielectric layer and the second conductive trace that extends from the second dielectric layer and the second conductive trace in the second vertical direction; then forming one or more fourth via openings that extend through the fourth dielectric layer and are aligned with and expose the second conductive trace; and then forming one or more fourth conductive traces that extend from the fourth dielectric layer in the second vertical direction and extend laterally on the fourth dielectric layer and extend through the fourth via opening in the first vertical direction to the second conductive trace, thereby electrically connecting the second conductive trace to the fourth conductive trace.

Providing the bump can include mechanically stamping a metal plate, thereby forming the bump in the metal plate and the cavity in the bump, wherein the bump is a stamped portion of the metal plate and the flange is an unstamped portion of the metal plate. The metal plate can be made of copper, aluminum, nickel, iron or their alloys.

Providing the adhesive can include providing a prepreg with uncured epoxy. Flowing the adhesive can include melting the uncured epoxy and compressing the uncured epoxy between the flange and the conductive layer or between the flange and the substrate. Solidifying the adhesive can include curing the uncured epoxy.

Flowing the adhesive can include filling the gap with the adhesive and forcing the adhesive beyond the bump and the conductive layer in the second vertical direction such that the adhesive contacts surfaces of the bump and the conductive layer that face in the second vertical direction.

Providing the first dielectric layer can include depositing the first dielectric layer on and in contact with the semiconductor device, the bump, the flange and the adhesive in the first vertical direction and spaced from the substrate (or the conductive layer) by the adhesive.

Providing the second dielectric layer can include depositing the second dielectric layer beyond the adhesive, the bump and the conductive layer in the second vertical direction and spaced from the first dielectric layer by the adhesive.

Providing the dielectric layers and the conductive traces can include simultaneously depositing the dielectric layers and then simultaneously depositing the plated layers.

Providing the conductive traces and the plated through-hole can include simultaneously depositing the plated layers and the connecting layer.

Depositing the first plated layer and the second plated layer can include simultaneously depositing the first and second plated layers using electroless plating and electrolytic plating.

The dielectric layers can be deposited and extend to peripheral edges of the assembly by numerous techniques including film lamination, roll coating, spin coating and spray-on deposition. The via openings can be formed through the dielectric layers by numerous techniques including laser drilling, plasma etching and photolithography. The through-hole can be formed by numerous techniques including mechanical drilling, laser drilling and plasma etching with or without wet etching. The plated layers and connecting layer can be deposited by numerous techniques including electroplating, electroless plating, evaporating, sputtering, and their combinations as a single layer or multiple layers. The plated layers can be patterned by numerous techniques including wet etching, electro-chemical etching, laser-assist etching, and their combinations to define the conductive traces.

The first via opening and the second via opening can have the same size, the first dielectric layer and the first conductive trace can have flat elongated surfaces that face in the first vertical direction and the second dielectric layer and the second conductive trace can have flat elongated surfaces that face in the second vertical direction.

By the above-mentioned method, the heat spreader of the stackable semiconductor assembly can include a bump and a flange, wherein (i) the bump is adjacent to and integral with the flange and extends from the flange in a second vertical direction, (ii) the flange extends laterally from the bump in lateral directions orthogonal to the second vertical direction, and (iii) a cavity in the bump faces in a first vertical direction opposite the second vertical direction, is covered by the bump in the second vertical direction and has an entrance at the flange.

The heat spreader can further include a base, wherein (i) the bump is adjacent to the base and extends from the base in the first vertical direction, (ii) the base extends from and covers the bump in the second vertical direction and extends laterally from the bump, (iii) the flange is spaced from the base, and (iv) the cavity is spaced from the base by the bump.

The heat spreader can be made of any material with thermal conductivity. Preferably, the heat spreader is made of metal. For instance, the heat spreader can consist essentially of copper, aluminum, nickel, iron, or their alloys. In any case, the heat spreader can provide heat dissipation and spreading from the semiconductor device to the next level assembly.

The bump can be integral with the flange. For instance, the bump and the flange can be a single-piece metal or include a single-piece metal at their interface, and the single-piece metal can be copper. The bump can also be coplanar with the adhesive at the second dielectric layer or the base if present. The bump can include a first bent corner adjacent to the second dielectric layer (or the base) and a second bent corner adjacent to the flange. The bump can also have an irregular thickness characteristic of stamping. The bump can also have a larger diameter or dimension at the flange than at the surface opposite the flange. For instance, the bump can have a cut-off conical or pyramidal shape in which its diameter or dimension increases as it extends in the first vertical direction. Accordingly, as the adhesive extends into the gap between the bump and the substrate or between the bump and the conductive layer in the second vertical direction, the adhesive can have an increasing thickness where it is adjacent to the bump. The bump can also have a cylindrical shape with a constant diameter. Accordingly, the adhesive can have a constant thickness in the gap between the bump and the substrate or between the bump and a conductive layer laminated to the substrate. The bump can also provide a recessed die paddle for the semiconductor device.

The cavity in the bump can have a larger diameter or dimension at its entrance than at its floor. For instance, the cavity can have a cut-off conical or pyramidal shape in which its diameter or dimension increases as it extends in the first vertical direction from its floor to its entrance. Alternatively, the cavity can have a cylindrical shape with a constant diameter. The cavity can also have a circular, square or rectangular periphery at its entrance and its floor. The cavity can also conform to the shape of the bump, extend into the opening and the aperture and extend across most of the bump in the vertical and lateral directions.

The flange can be sandwiched between the first build-up circuitry and the adhesive. The flange can also have a circular, square or rectangular periphery. In addition, the flange may be spaced from or extend to peripheral edges of the assembly.

The first build-up circuitry can cover and extend beyond the semiconductor device, the flange and the adhesive in the first vertical direction, while the second build-up circuitry can cover and extend beyond the bump and the adhesive in the second vertical direction. The first build-up circuitry can also extend from the semiconductor device and the flange in the first vertical direction, while the second build-up circuitry can also extend from the bump (or the base) in the second vertical direction.

The first and second build-up circuitries can respectively include first and second interconnect pads that are defined from selected portions of outer conductive traces to provide electrical contacts for the next level assembly or another electronic device such as a semiconductor chip, a plastic package or another semiconductor assembly. The first interconnect pad extends to or beyond the first conductive trace in the first vertical direction and includes an exposed contact surface that faces in the first vertical direction, while the second interconnect pad extends to or beyond the second conductive trace in the second vertical direction and includes an exposed contact surface that faces in the second vertical direction. For instance, the first interconnect pad can be adjacent to and integral with a third conductive trace, and the second interconnect pad can be adjacent to and integral with a fourth conductive trace. In addition, the first conductive trace can provide an electrical interconnection between the first interconnect pad and the plated through-hole, and the second conductive trace can provide an electrical interconnection between the second interconnect pad and the plated through-hole. As a result, the stackable semiconductor assembly can include electrical contacts that are electrically connected to one another and located on opposite surfaces that face in opposite vertical directions so that the semiconductor assembly is stackable.

The plated through-hole can provide signal routing in the vertical direction between the first build-up circuitry and the second build-up circuitry. For instance, the plated though-hole at a first end can extend to and be electrically connected to an outer or inner conductive layer of the first build-up circuitry and at a second end can extend to and be electrically connected to an outer or inner conductive layer of the second build-up circuitry. Alternatively, the plated through-hole at the first end can extend to and be electrically connected to an inner pad that is spaced from and coplanar with and has the same thickness as the flange and electrically connected to the first build-up circuitry at a first conductive trace in a first via opening. Likewise, the plated through-hole at the second end can extend to and be electrically connected to an inner pad that is spaced from and coplanar with and has the same thickness as the base where closest to one another and electrically connected to the second build-up circuitry at a second conductive trace in a second via opening. In any case, the plated through-hole extends vertically through the adhesive and the substrate (if present), is spaced from the heat spreader, and is in an electrically conductive path between the first build-up circuitry and the second build-up circuitry.

The adhesive between the flange and the substrate (or the conductive layer) can flow into a gap located in the aperture between the bump and the substrate (or the conductive layer), as above mentioned. Accordingly, the adhesive can contact the bump, the flange, the substrate (if present), the plated through-hole and the first dielectric layer, can be sandwiched between the first dielectric layer and the second dielectric layer and spaced from the first conductive trace and the second conductive trace, extend laterally from the bump to peripheral edges of the assembly and can have a first thickness (in the first/second vertical directions) where it is adjacent to the flange and a second thickness (in the lateral directions orthogonal to the first/second vertical directions) where it is adjacent to the bump that is different from the first thickness.

The semiconductor device can be a packaged or unpackaged semiconductor chip. For instance, the semiconductor device can be a land grid array (LGA) package or wafer level package (WLP) that includes a semiconductor chip. Alternatively, the semiconductor device can be a semiconductor chip.

The substrate can extend to peripheral edges of the assembly and be made of organic materials such as epoxy, glass-epoxy, and polyimide. The substrate can also be made of thermally conductive materials such as aluminum oxide ($Al_2O_3$), aluminum nitride (AlN), silicon nitride (SiN), silicon (Si), etc. Alternatively, the substrate can be a single layer structure or a multi-layer structure such as a laminated circuit board or a multi-layer ceramic board. Furthermore, the substrate can be laminated to a conductive layer and the aperture can extend through the substrate and the conductive layer.

The assembly can be a first-level or second-level single-chip or multi-chip device. For instance, the assembly can be a first-level package that contains a single chip or multiple chips. Alternatively, the assembly can be a second-level module that contains a single package or multiple packages, and each package can contain a single chip or multiple chips.

The present invention has numerous advantages. The bump and the flange can be integral with one another, thereby providing excellent heat spreading, electromagnetic shielding and a moisture barrier for the semiconductor device for better thermal and electrical performance as well as environmental reliability. The mechanically-formed cavity in the bump can provide a well-defined space for semiconductor device placement. As a result, the likely shifting and cracking of the embedded chip during lamination can be avoided, thereby enhancing manufacturing yield and reducing cost. The adhesive can be sandwiched between the bump and the conductive layer, between the bump and the substrate and between the flange and the substrate, thereby providing a robust mechanical bond between the heat spreader and the substrate. The first build-up circuitry can provide electrical connections to the semiconductor device with plated metal without wire bonds or solder joints, thereby increasing reliability. The first and second build-up circuitries can provide signal routing with simple circuitry patterns or flexible multi-layer signal routing with complex circuitry patterns. The plated through-hole can provide vertical signal routing between the two build-up circuitries with respective interconnect pads at both sides of the assembly, thereby providing the assembly with stacking capability.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which:

FIGS. 1A and 1B are cross-sectional views showing a bump and a flange in accordance with an embodiment of the present invention;

FIGS. 1C and 1D are top and bottom views, respectively, corresponding to FIG. 1B;

DETAILED DESCRIPTION OF THE INVENTION

[Embodiment 1]

Figure 2A:
FIGS. 2A and 2B are cross-sectional views showing an adhesive in accordance with an embodiment of the present invention.

FIGS. 1A and 1B are cross-sectional views showing a method of making a bump and a flange in accordance with an embodiment of the present invention, and FIGS. 1C and 1D are top and bottom views, respectively, corresponding to FIG. 1B.

FIG. 1A. is a cross-sectional view of metal plate 10 which includes opposing major surfaces 12 and 14. Metal plate 10 is illustrated as a copper plate with a thickness of 100 microns. Copper has high thermal conductivity, good flexibility and low cost. Metal plate 10 can be various metals such as copper, aluminum, alloy 42, iron, nickel, silver, gold, combinations thereof, and alloys thereof.

FIGS. 1B, 1C and 1D are cross-sectional, top and bottom views, respectively, of metal plate 10 with bump 16, flange 18 and cavity 20. Bump 16 and cavity 20 are formed by mechanically stamping metal plate 10. Thus, bump 16 is a stamped portion of metal plate 10 and flange 18 is an unstamped portion of metal plate 10.

Bump 16 is adjacent to and integral with flange 18 and extends from flange 18 in the downward direction. Bump 16 includes bent corners 22 and 24, tapered sidewall 26 and floor 28. Bent corners 22 and 24 are bent by the stamping operation. Bent corner 22 is adjacent to flange 18 and tapered sidewall 26 and bent corner 24 is adjacent to tapered sidewall 26 and floor 28. Tapered sidewall 26 extends outwardly as it extends in the upward direction and floor 28 extends laterally in lateral directions (such as left and right) orthogonal to the upward and downward directions. Thus, bump 16 has a cut-off pyramidal shape (resembling a frustum) in which its diameter decreases as it extends downwardly from flange 18 to floor 28 and increases as it extends upwardly from floor 28 to flange 18. Bump 16 has a height of 300 microns relative to flange 18, a dimension of 10.5 mm by 8.5 mm at flange 18 and a dimension of 10.25 mm by 8.25 mm at floor 28. Furthermore, bump 16 has an irregular thickness due to the stamping operation. For instance, tapered sidewall 26 is thinner than floor 28 since it is elongated by the stamping operation. Bump 16 is shown with a uniform thickness for convenience of illustration.

Flange 18 extends laterally from bump 16 in the lateral directions, is flat and has a thickness of 100 microns.

Cavity 20 faces in the upward direction, extends into bump 16, is covered by bump 16 in the downward direction and has an entrance at flange 18. Cavity 20 also conforms to the shape of bump 16. Thus, cavity 20 has a cut-off pyramidal shape (resembling a frustum) in which its diameter decreases as it extends downwardly from its entrance at flange 18 to floor 28 and increases as it extends upwardly from floor 28 to its entrance at flange 18. Furthermore, cavity 20 extends across most of bump 16 in the vertical and lateral directions and has a depth of 300 microns.

Figure 2B:
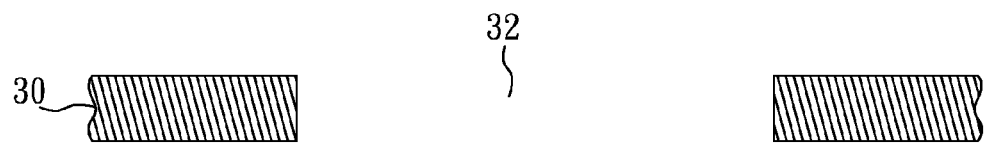
Figure 2C:
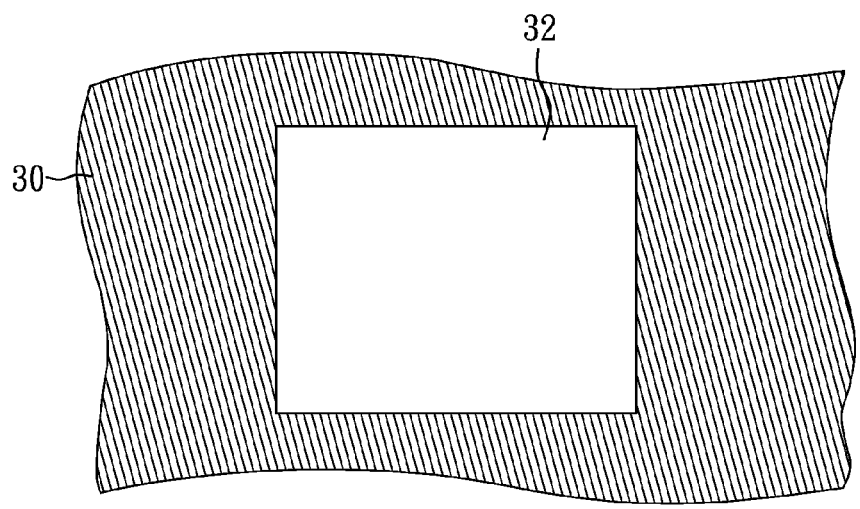
FIGS. 2C and 2D are top and bottom views, respectively, corresponding to FIG. 2B.
Figure 2D:
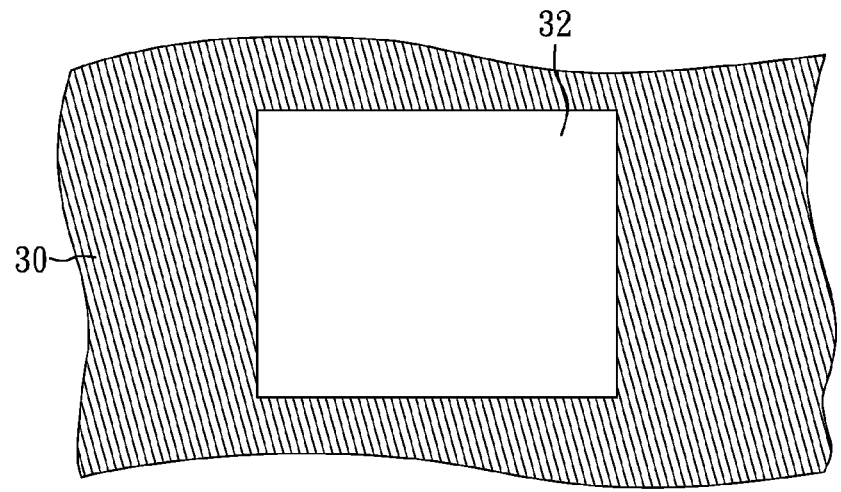

FIGS. 2A and 2B are cross-sectional views showing a method of making an adhesive in accordance with an embodiment of the present invention, and FIGS. 2C and 2D are top and bottom views, respectively, corresponding to FIG. 2B.

FIG. 2A is a cross-sectional view of adhesive 30. Adhesive 30 is illustrated as a prepreg with B-stage uncured epoxy provided as a non-solidified un-patterned sheet with a thickness of 150 microns.

Adhesive 30 can be various dielectric films or prepregs formed from numerous organic or inorganic electrical insulators. For instance, adhesive 30 can initially be a prepreg in which thermosetting epoxy in resin form impregnates a reinforcement and is partially cured to an intermediate stage.

The epoxy can be FR-4 although other epoxies such as polyfunctional and bismaleimide triazine (BT) are suitable. For specific applications, cyanate esters, polyimide and PTFE are also suitable. The reinforcement can be E-glass although other reinforcements such as S-glass, D-glass, quartz, kevlar aramid and paper are suitable. The reinforcement can also be woven, non-woven or random microfiber. A filler such as silica (powdered fused quartz) can be added to the prepreg to improve thermal conductivity, thermal shock resistance and thermal expansion matching. Commercially available prepregs such as SPEEDBOARD C prepreg by W.L. Gore & Associates of Eau Claire, Wis. are suitable.

FIGS. 2B, 2C and 2D are cross-sectional, top and bottom views, respectively, of adhesive 30 with opening 32. Opening 32 is a window that extends through adhesive 30 and has a dimension of 10.55 mm by 8.55 mm. Opening 32 is formed by punching through the prepreg and can be formed by other techniques such as laser cutting.

Figure 3A:
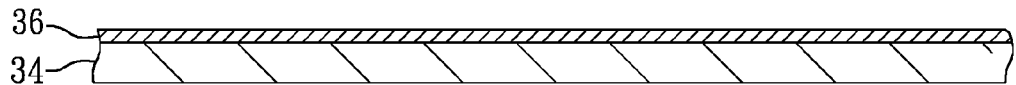
FIGS. 3A and 3B are cross-sectional views showing a laminated structure including a substrate and a conductive layer in accordance with an embodiment of the present invention.
Figure 3B:
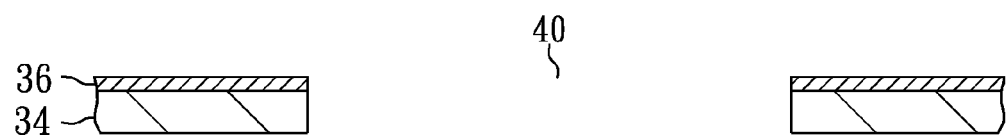
Figure 3C:
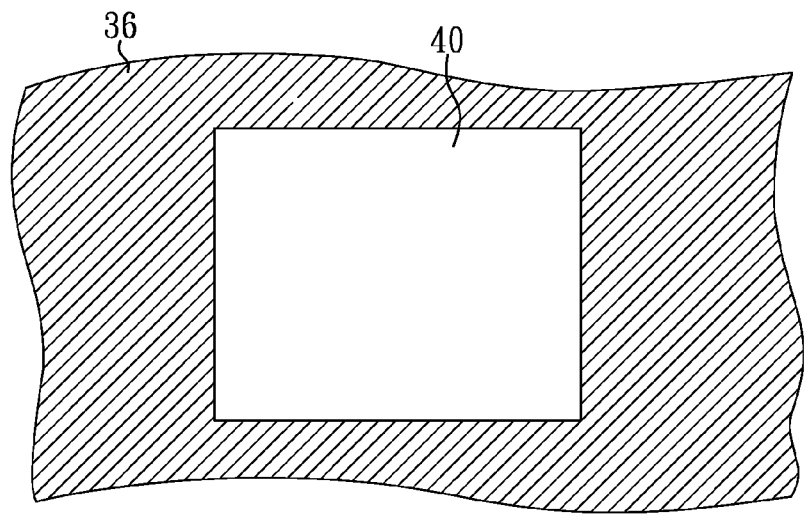
FIGS. 3C and 3D are top and bottom views, respectively, corresponding to FIG. 3B.
Figure 3D:
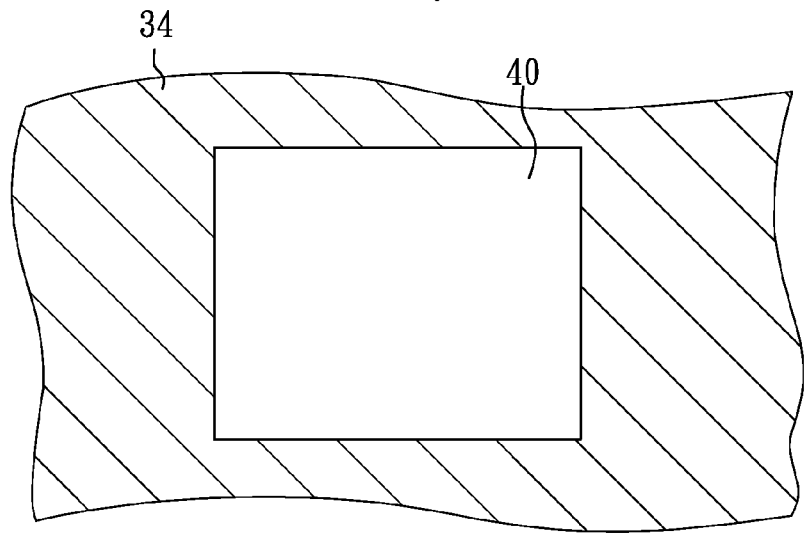

FIGS. 3A and 3B are cross-sectional views showing a method of making a laminated structure in accordance with an embodiment of the present invention, and FIGS. 3C and 3D are top and bottom views, respectively, corresponding to FIG. 3B.

FIG. 3A is a cross-sectional view of a laminated structure that includes substrate 34 and conductive layer 36. For instance, substrate 34 is a glass-epoxy material with a thickness of 150 microns and conductive layer 36 that contacts and extends above and is laminated to substrate 34 is an unpatterned copper sheet with a thickness of 30 microns.

FIGS. 3B, 3C and 3D are cross-sectional, top and bottom views, respectively, of the laminated structure of substrate 34 and conductive layer 36 with aperture 40. Aperture 40 is a window that extends through substrate 34 and conductive layer 36 and has a dimension of 10.55 mm by 8.55 mm. Aperture 40 is formed by punching through substrate 34 and conductive layer 36 and can be formed with other techniques such as laser cutting with or without wet etching. Thus, opening 32 and aperture 40 have the same dimension. Furthermore, opening 32 and aperture 40 can be formed in the same manner with the same punch at the same punching station.

Substrate 34 is illustrated as a single layer dielectric structure. Substrate 34 can also be an electrical interconnect such as a multi-layer printed circuit board or a multi-layer ceramic board. Accordingly, substrate 34 can include embedded circuitry.

Figure 4A:
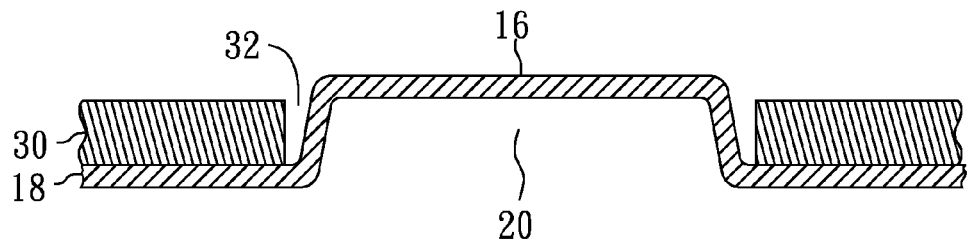
FIGS. 4A-4F are cross-sectional views showing a method of making a thermal board in accordance with an embodiment of the present invention.
Figure 4B:
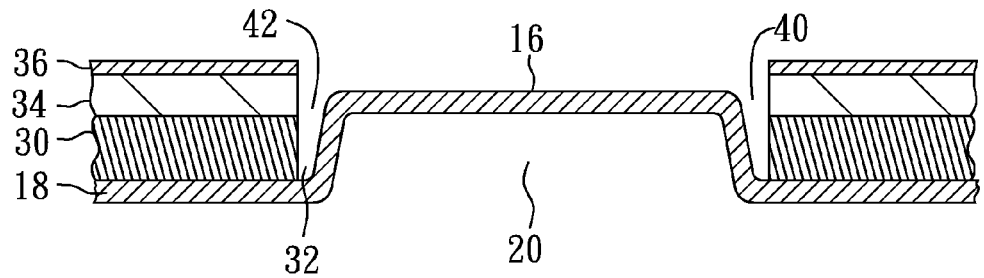
Figure 4C:
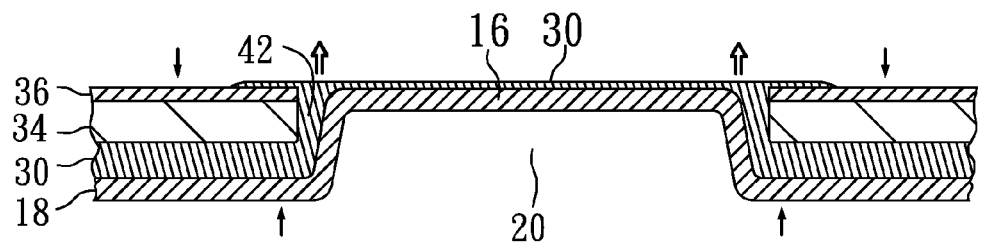
Figure 4D:
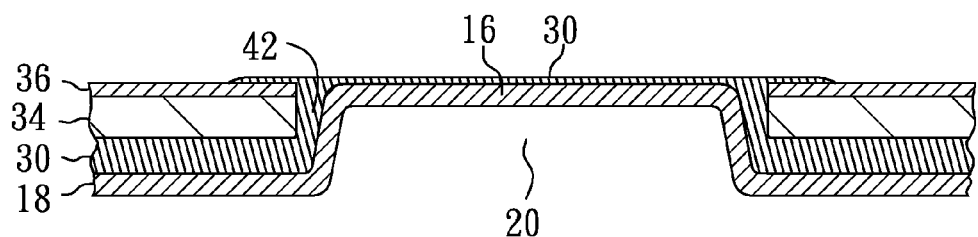
Figure 4E:
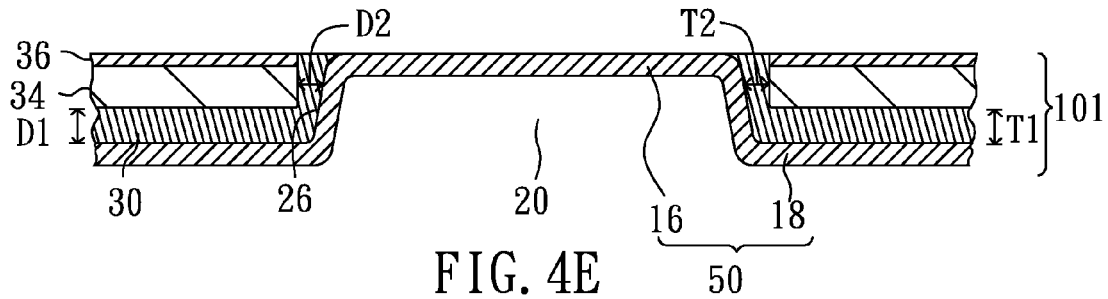
Figure 4F:
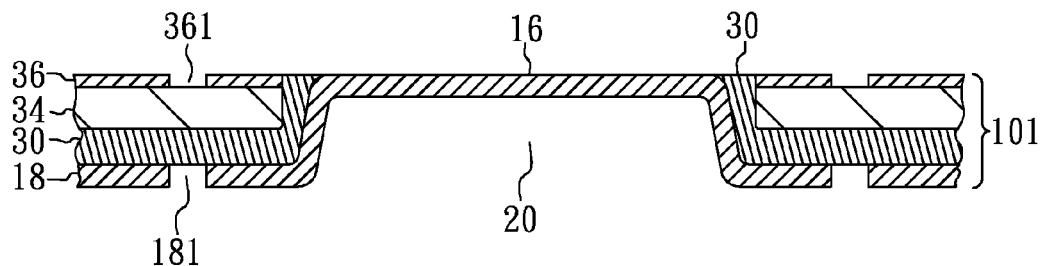

FIGS. 4A-4F are cross-sectional views showing a method of making a thermal board, as shown in FIG. 4F, that includes bump 16, flange 18, adhesive 30, substrate 34 and conductive layer 36 in accordance with an embodiment of the present invention.

In FIGS. 4A and 4B the structure is inverted to a cavity-down position so that gravity assists with mounting adhesive 30 and substrate 34 and conductive layer 36 on flange 18 and in FIGS. 4C-4F the structure remains in the cavity-down position. Thereafter, in FIGS. 5A-5K the structure is inverted again to the cavity-up position as in FIGS. 1A-1D. Thus, cavity 20 faces downward in FIGS. 4A-4F and upward in FIGS. 5A-5K. However, the relative orientation of the structure does not change. Cavity 20 faces in the first vertical direction and is covered by bump 16 in the second vertical direction regardless of whether the structure is inverted, rotated or slanted. Likewise, bump 16 extends beyond substrate 34 in the first vertical direction and extends from flange 18 in the second vertical direction regardless of whether the structure is inverted, rotated or slanted. Hence, the first and second vertical directions are oriented relative to the structure and remain opposite to one another and orthogonal to the lateral directions.

FIG. 4A is a cross-sectional view of the structure with adhesive 30 mounted on flange 18. Adhesive 30 is mounted by lowering it onto flange 18 as bump 16 is inserted into and through and upwards in opening 32. Adhesive 30 eventually contacts and rests on flange 18. Preferably, bump 16 is inserted into and extends through opening 32 without contacting adhesive 30 and is aligned with and centrally located within opening 32.

FIG. 4B is a cross-sectional view of the structure with substrate 34 and conductive layer 36 mounted on adhesive 30. Substrate 34 laminated with conductive layer 36 is mounted by lowering it onto adhesive 30 as bump 16 is inserted into and upwards in aperture 40. Substrate 34 eventually contacts and rests on adhesive 30.

Bump 16 is inserted into but not through aperture 40 without contacting substrate 34 or conductive layer 36 and is aligned with and centrally located within aperture 40. As a result, gap 42 is located in aperture 40 between bump 16 and substrate 34. Gap 42 laterally surrounds bump 16 and is laterally surrounded by substrate 34. In addition, opening 32 and aperture 40 are precisely aligned with one another and have the same dimension.

At this stage, substrate 34 laminated with conductive layer 36 is mounted on and contacts and extends above adhesive 30. Bump 16 extends through opening 32 into aperture 40, is 30 microns below the top surface of conductive layer 36 and is exposed through aperture 40 in the upward direction. Adhesive 30 contacts and is sandwiched between flange 18 and substrate 34, contacts substrate 34 but is spaced from conductive layer 36 and remains a non-solidified prepreg with B-stage uncured epoxy, and gap 42 is filled with air.

FIG. 4C is a cross-sectional view of the structure with adhesive 30 in gap 42. Adhesive 30 is flowed into gap 42 by applying heat and pressure. In this illustration, adhesive 30 is forced into gap 42 by applying downward pressure to conductive layer 36 and/or upward pressure to flange 18, thereby moving flange 18 and substrate 34 towards one another and applying pressure to adhesive 30 while simultaneously applying heat to adhesive 30. Adhesive 30 becomes compliant enough under the heat and pressure to conform to virtually any shape. As a result, adhesive 30 sandwiched between flange 18 and substrate 34 is compressed, forced out of its original shape and flows into and upward in gap 42. Flange 18 and substrate 34 continue to move towards one another and adhesive 30 eventually fills gap 42. Moreover, adhesive 30 remains sandwiched between and continues to fill the reduced space between flange 18 and substrate 34.

For instance, flange 18 and conductive layer 36 can be disposed between top and bottom platens (not shown) of a press. In addition, a top cull plate and top buffer paper (not shown) can be sandwiched between conductive layer 36 and the top platen, and a bottom cull plate and bottom buffer paper (not shown) can be sandwiched between flange 18 and the bottom platen. The stack includes the top platen, top cull plate, top buffer paper, substrate 34 and conductive layer 36, adhesive 30, flange 18, bottom buffer paper, bottom cull plate and bottom platen in descending order. Furthermore, the stack may be positioned on the bottom platen by tooling pins (not shown) that extend upward from the bottom platen through registration holes (not shown) in flange 18.

The platens are heated and move towards one another, thereby applying heat and pressure to adhesive 30. The cull plates disperse the heat from the platens so that it is more uniformly applied to flange 18 and substrate 34 and thus adhesive 30, and the buffer papers disperse the pressure from the platens so that it is more uniformly applied to flange 18 and substrate 34 and thus adhesive 30. Initially, substrate 34 contacts and presses down on adhesive 30. As the platen motion and heat continue, adhesive 30 between flange 18 and substrate 34 is compressed, melted and flows into and upward in gap 42 and across substrate 34 to conductive layer 36. For instance, the uncured epoxy is melted by the heat and the molten uncured epoxy is squeezed by the pressure into gap 42, however the reinforcement and the filler remain between flange 18 and substrate 34. Adhesive 30 elevates more rapidly than bump 16 in aperture 40 and fills gap 42. Adhesive 30 also rises slightly above aperture 40 and overflows onto the top surfaces of bump 16 and conductive layer 36 before the platen motion stops. This may occur due to the prepreg being slightly thicker than necessary. As a result, adhesive 30 creates a thin coating on the top surfaces of bump 16 and conductive layer 36. The platen motion is eventually blocked by bump 16 and the platens become stationary but continue to apply heat to adhesive 30.

The upward flow of adhesive 30 in gap 42 is shown by the thick upward arrows, the upward motion of bump 16 and flange 18 relative to substrate 34 is shown by the thin upward arrows, and the downward motion of substrate 34 relative to bump 16 and flange 18 is shown by the thin downward arrows.

FIG. 4D is a cross-sectional view of the structure with adhesive 30 solidified.

For instance, the platens continue to clamp bump 16 and flange 18 and apply heat after the platen motion stops, thereby converting the B-stage molten uncured epoxy into C-stage cured or hardened epoxy. Thus, the epoxy is cured in a manner similar to conventional multi-layer lamination. After the epoxy is cured, the platens move away from one another and the structure is released from the press.

Adhesive 30 as solidified provides a secure robust mechanical bond between bump 16 and substrate 34 and between flange 18 and substrate 34. Adhesive 30 can withstand normal operating pressure without distortion or damage and is only temporarily distorted under unusually high pressure. Furthermore, adhesive 30 can absorb thermal expansion mismatch between bump 16 and substrate 34 and between flange 18 and substrate 34.

At this stage, bump 16 and conductive layer 36 are essentially coplanar with one another and adhesive 30 and conductive layer 36 extend to a top surface that faces in the upward direction. For instance, adhesive 30 between flange 18 and substrate 34 has a thickness of 120 microns which is 30 microns less than its initial thickness of 150 microns, bump 16 ascends 30 microns in aperture 40 and substrate 34 descends 30 microns relative to bump 16. The 300 micron height of bump 16 is essentially the same as the combined height of conductive layer 36 (30 microns), substrate 34 (150 microns) and the underlying adhesive 30 (120 microns). Furthermore, bump 16 continues to be centrally located in opening 32 and aperture 40 and spaced from substrate 34 and adhesive 30 fills the space between flange 18 and substrate 34 and fills gap 42. Adhesive 30 extends across substrate 34 in gap 42. That is, adhesive 30 in gap 42 extends in the upward and downward directions across the thickness of substrate 34 at the outer sidewall of gap 42. Adhesive 30 also includes a thin top portion above gap 42 that contacts the top surfaces of bump 16 and conductive layer 36 and extends above bump 16 by 10 microns.

FIG. 4E is a cross-sectional view of the structure after upper portions of bump 16, adhesive 30 and conductive layer 36 are removed by grinding. For instance, a rotating diamond sand wheel and distilled water are applied to the top of the structure. Initially, the diamond sand wheel grinds only adhesive 30. As the grinding continues, adhesive 30 becomes thinner as its grinded surface migrates downwardly. Eventually the diamond sand wheel contacts bump 16 and conductive layer 36 (not necessarily at the same time), and as a result, begins to grind bump 16 and conductive layer 36 as well. As the grinding continues, bump 16, adhesive 30 and conductive layer 36 become thinner as their grinded surfaces migrate downwardly. The grinding continues until the desired thickness has been removed. Thereafter, the structure is rinsed in distilled water to remove contaminants.

The grinding removes a 20 micron thick upper portion of adhesive 30, a 10 micron thick upper portion of bump 16 and a 10 micron thick upper portion of conductive layer 36. The decreased thickness does not appreciably affect bump 16 or adhesive 30. However, it substantially reduces the thickness of conductive layer 36 from 30 microns to 20 microns. After the grinding, bump 16, adhesive 30 and conductive layer 36 are coplanar with one another at a smoothed lapped lateral top surface that is above substrate 34 and faces in the upward direction.

At this stage, as shown in FIG. 4E, thermal board 101 includes adhesive 30, substrate 34, conductive layer 36 and heat spreader 50. Heat spreader 50 includes bump 16 and flange 18. Bump 16 is adjacent to flange 18 at bent corner 22, extends from flange 18 in the upward direction and is integral with flange 18. Bump 16 extends into and remains centrally located within opening 32 and aperture 40, and is coplanar at its top with an adjacent portion of adhesive 30. Bump 16 is spaced from substrate 34 and retains its cut-off pyramidal shape in which its dimension increases as it extends downwardly.

Cavity 20 faces in the downward direction, extends into remains centrally located within bump 16, opening 32 and aperture 40 and is covered by bump 16 in the upward direction. Cavity 20 conforms to the shape of bump 16, extends across most of bump 16 in the vertical and lateral directions and retains its cut-off pyramidal shape in which its dimension decreases as it extends upwardly from its entrance at flange 18.

Flange 18 extends laterally from bump 16, extends below adhesive 30, substrate 34, opening 32 and aperture 40, contacts adhesive 30 and is spaced from substrate 34.

Adhesive 30 contacts and is sandwiched between and fills the space between bump 16 and substrate 34 in gap 42 and contacts substrate 34 and flange 18 outside gap 42. Adhesive 30 covers and surrounds tapered sidewall 26 of bump 16 in the lateral directions, extends laterally from bump 16 to peripheral edges of the assembly and is solidified. Accordingly, adhesive 30 has first thickness T1 where it is adjacent to flange 18 and second thickness T2 where it is adjacent to bump 16 that is different from first thickness T1. That is, distance D1 in the vertical directions between flange 18 and substrate 34 is different from distance D2 in the lateral directions between bump 16 and substrate 34. Furthermore, as adhesive 30 extends away from flange 18 into gap 42 between bump 16 and substrate 34, adhesive 30 can have an increasing thickness where it is adjacent to bump 16 owing to that bump 16 has an increasing dimension as it extends towards flange 18. Thermal board 101 can accommodate multiple semiconductor devices rather than one with a single bump or multiple bumps. Thus, multiple semiconductor devices can be mounted on a single bump or separate semiconductor devices can be mounted on separate bumps.

Thermal board 101 with multiple bumps for multiple semiconductor devices can be accomplished by stamping metal plate 10 to include additional bumps 16, adjusting adhesive 30 to include additional openings 32 and adjusting substrate 34 and conductive layer 36 to include additional apertures 40.

Subsequently, as shown in FIG. 4F, first openings 181 and second openings 361 are respectively formed through flange 18 and conductive layer 36 at predetermined locations for subsequent formation of plated through-holes.

FIGS. 5A-5K are cross-sectional views showing a method of making a stackable semiconductor assembly that includes a thermal board, a semiconductor device, a plated through-hole, first build-up circuitry and second build-up circuitry in accordance with an embodiment of the present invention.

Figure 5A:
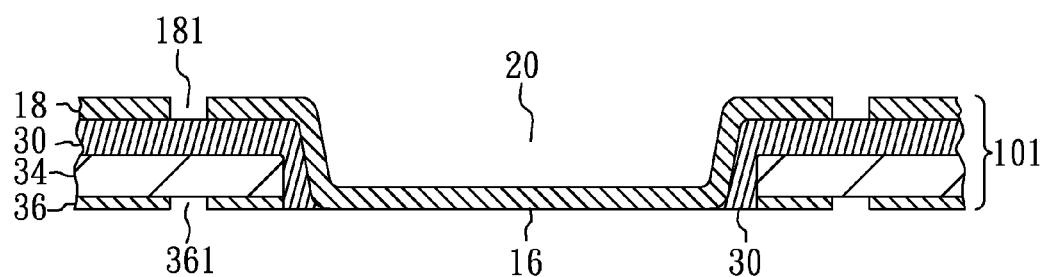
FIGS. 5A-5K are cross-sectional views showing a method of making a stackable semiconductor assembly that includes a thermal board, a semiconductor device, a plated through-hole, first build-up circuitry and second build-up circuitry in accordance with an embodiment of the present invention.
Figure 5B:
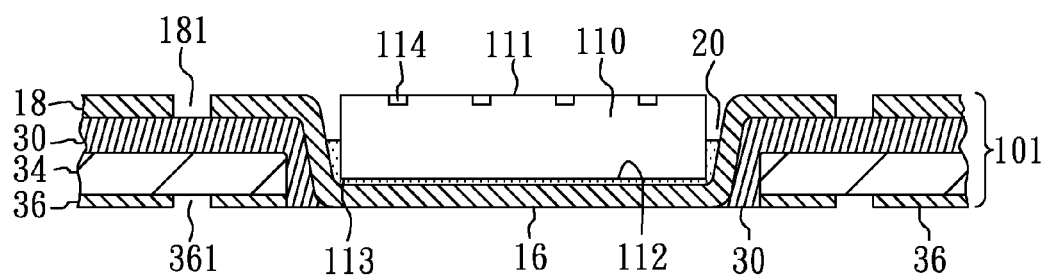
Figure 5C:
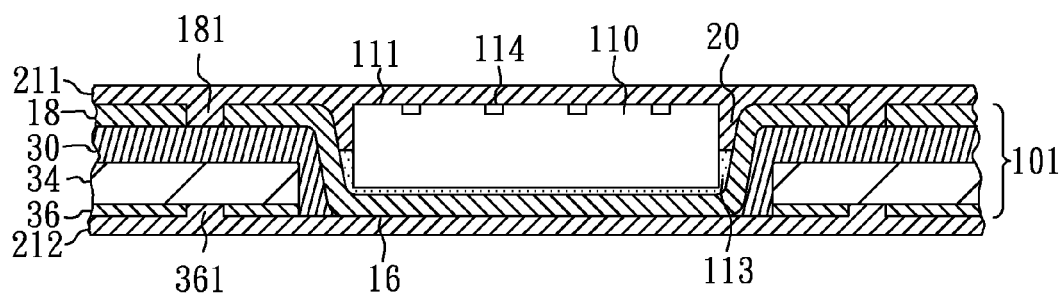
Figure 5D:
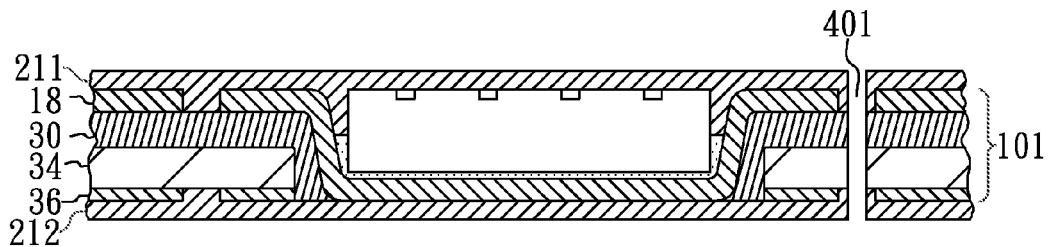
Figure 5E:
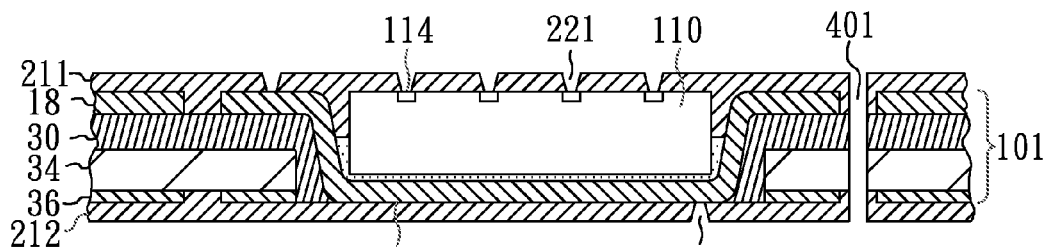
Figure 5F:
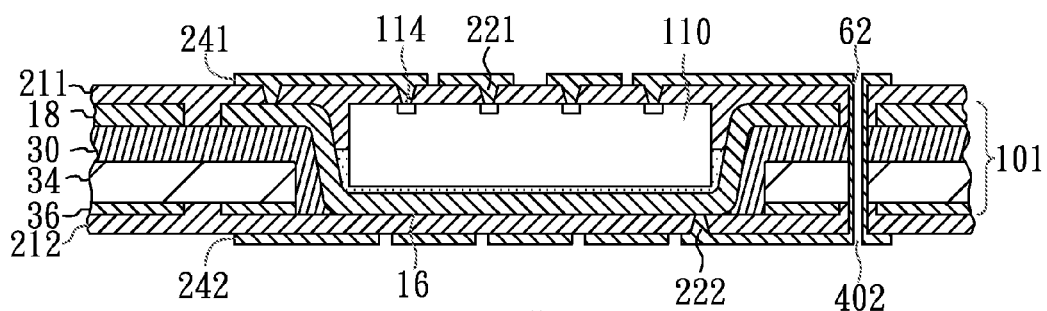
Figure 5G:
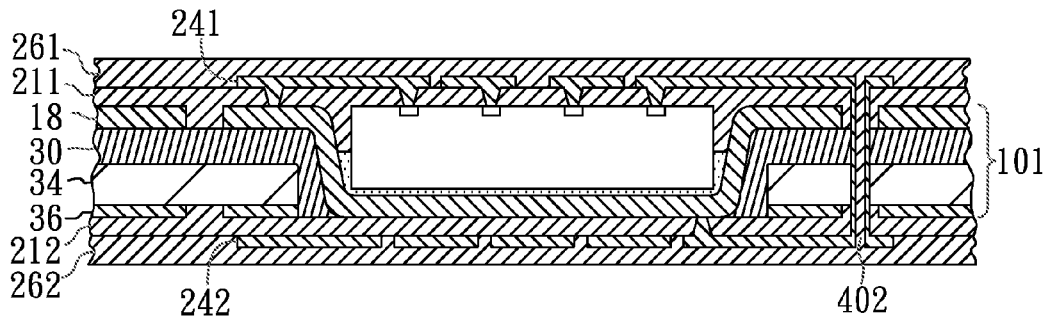
Figure 5H:
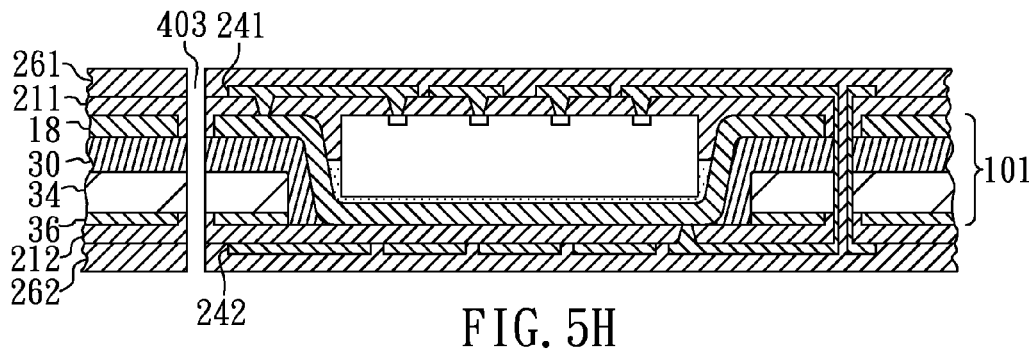
Figure 5I:
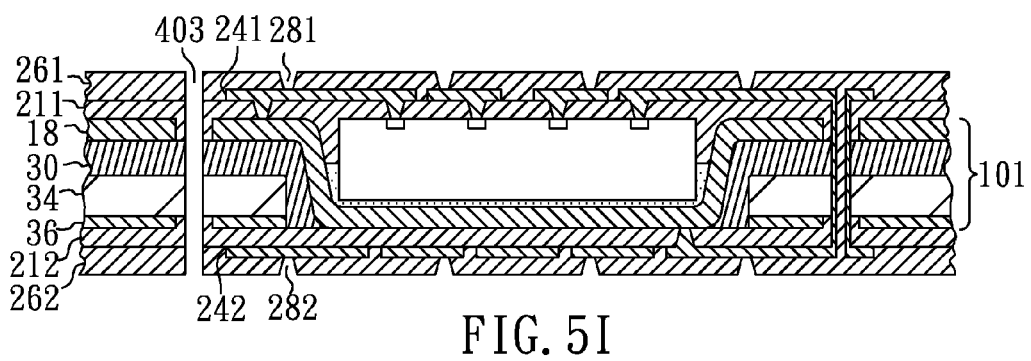
Figure 5J:
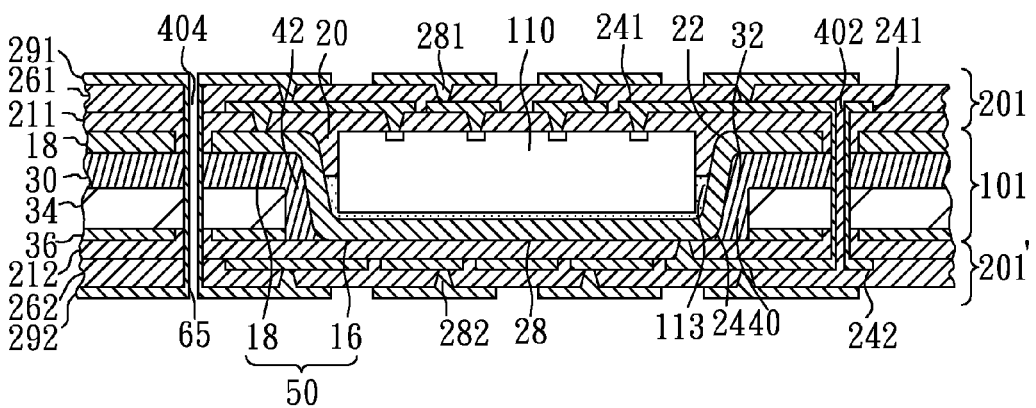
Figure 5K:
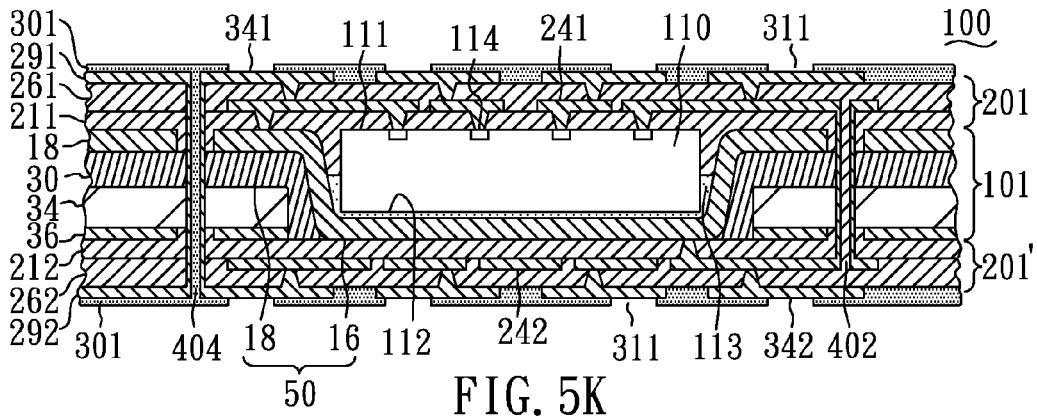

As shown in FIG. 5K, stackable semiconductor assembly 100 includes thermal board 101, semiconductor chip 110, die attach 113, first build-up circuitry 201, second build-up circuitry 201', plated through-holes 402, 404 and solder mask material 301. Semiconductor chip 110 includes top surface 111, bottom surface 112 and contact pads 114. Top surface 111 is the active surface and includes contact pads 114 and bottom surface 112 is the thermal contact surface. Thermal board 101 includes adhesive 30, substrate 34, conductive layer 36 and heat spreader 50. Heat spreader 50 includes bump 16 and flange 18. First build-up circuitry 201 includes first dielectric layer 211, first conductive traces 241, third dielectric layer 261 and third conductive traces 291 which include first interconnect pads 341, while second build-up circuitry 201' includes second dielectric layer 212, second conductive traces 242, fourth dielectric layer 262 and fourth conductive traces 292 which include second interconnect pads 342.

FIG. 5A is a cross-sectional view of thermal board 101 after it is inverted from FIG. 4F.

FIG. 5B is a cross-sectional view of thermal board 101 with semiconductor chip 110 mounted on bump 16 by die attach 113. Semiconductor chip 110, which includes contact pads 114 on its top surface 111 (i.e. active surface), is mounted by lowering it into cavity 20, and eventually contacts and rests on die attach 113. In particular, bump 16 covers semiconductor chip 110 in the downward direction and provides a recessed die paddle for semiconductor chip 110. Die attach 113 contacts and is sandwiched between bump 16 and semiconductor chip 110.

Die attach 113 is initially a silver-filled epoxy paste with high thermal conductivity that is selectively screen printed into cavity 20 on bump 16 and then semiconductor chip 110 placed on the epoxy paste using a pick-up head and an automated pattern recognition system in step-and-repeat fashion. Thereafter, the epoxy paste is heated and hardened at a relatively low temperature such as 190° C. to form hardened die attach 113. Semiconductor chip 110 has a thickness of 275 microns and die attach 113 has a thickness of 20 microns. As a result, the combined height of semiconductor chip 110 and the underlying die attach 113 is 295 microns which is 5 microns less than the depth of cavity 20 (300 microns). Semiconductor chip 110 has a length of 10 mm and width of 8 mm.

Subsequently, first and second build-up circuitries are respectively formed on both sides of thermal board 101 as described below.

FIG. 5C is a cross-sectional view of the structure with first dielectric layer 211 and second dielectric layer 212, such as epoxy resin, glass-epoxy, polyimide and the like, respectively disposed on both surfaces of thermal board 101. First dielectric layer 211 covers semiconductor chip top surface 111 (i.e. active surface), contact pads 114, die attach 113, bump 16, flange 18 and adhesive 30 in the upward direction, while second dielectric layer 212 covers bump 16, adhesive 30, substrate 34 and conductive layer 36 in the downward direction. First dielectric layer 211 extends into and fills the remaining space in cavity 20, thereby contacting bump 16, semiconductor chip 110 and die attach 113, and is sandwiched between bump 16 and semiconductor chip 110. First dielectric layer 211 also contacts flange 18 and adhesive 30 and fills first openings 181 outside cavity 20, while second dielectric layer 212 fills second openings 361 and contacts bump 16, adhesive 30, substrate 34 and conductive layer 36. First dielectric layer 211 and second dielectric layer 212 may be deposited by numerous techniques including film lamination, roll coating, spin coating and spray-on deposition. First dielectric layer 211 and second dielectric layer 212 may be treated by plasma etching or coated with an adhesion promoter (not shown) to promote adhesion. First dielectric layer 211 and second dielectric layer 212 have a thickness of 50 microns.

FIG. 5D is a cross-sectional view of the structure with through-hole 401. Through-hole 401 corresponds to and is axially aligned with and concentrically positioned within a subset of first and second openings 181, 361 respectively in flange 18 and conductive layer 36, and extends through first dielectric layer 211, flange 18, adhesive 30, substrate 34, conductive layer 36 and second dielectric layer 212 in the vertical direction. Through-hole 401 is formed by mechanical drilling and can be formed by other techniques such as laser drilling and plasma etching with or without wet etching.

FIG. 5E is a cross-sectional view of the structure showing first via openings 221 formed through first dielectric layer 211 to expose contact pads 114 and selected portions of flange 18. Also shown in FIG. 5E is second via opening 222 formed through second dielectric layer 212 to expose selected portions of bump 16. First and second via openings 221, 222 may be formed by numerous techniques including laser drilling, plasma etching and photolithography. Laser drilling can be enhanced by a pulsed laser. Alternatively, a scanning laser beam with a metal mask can be used. First and second via openings 221, 222 have a diameter of 50 microns and have the same size and shape.

Referring now to FIG. 5F, first conductive traces 241 are formed on first dielectric layer 211. First conductive traces 241 extend from first dielectric layer 211 in the upward direction, extend laterally on first dielectric layer 211 and extend into first via openings 221 in the downward direction to make electrical contact with contact pads 114 and flange 18. Also shown in FIG. 5F are second conductive traces 242 formed on second dielectric layer 212. Second conductive traces 242 extend from second dielectric layer 212 in the downward direction, extend laterally on second dielectric layer 212 and extend into second via opening 222 in the upward direction to make electrical contact with bump 16. First and second conductive traces 241, 242 can be deposited by numerous techniques including electroplating, electroless plating, evaporating, sputtering, and their combinations as a single layer or multiple layers.

For instance, first conductive traces 241 and second conductive traces 242 are respectively deposited as a first conductive layer and a second conductive layer by first dipping the structure in an activator solution to render first dielectric layer 211 and second dielectric layer 212 catalytic to electroless copper, then a thin copper layer is electrolessly plated to serve as the seeding layer before a second copper layer is electroplated on the seeding layer to a desirable thickness. Alternatively, the seeding layer can be formed by sputtering a thin film such as titanium/copper onto first and second dielectric layers 211, 212 as well as into first and second via openings 221, 222 before depositing the electroplated copper layer on the seeding layer. Once the desired thickness is achieved, the first conductive layer and the second conductive layer (i.e. the combination of the electroplated copper layer and the seeding layer) are patterned to form first conductive traces 241 and second conductive traces 242, respectively. First and second conductive traces 241, 242 can be patterned by numerous techniques including wet etching, electro-chemical etching, laser-assist etching, and their combinations with an etch mask (not shown) thereon that defines first and second conductive traces 241, 242.

Also shown in FIG. 5F is connecting layer 62 deposited in through-hole 401 to provide plated through-hole 402. Connecting layer 62 is a hollow tube that covers the inner sidewall of through-hole 401 in lateral directions and extends vertically to electrically connect first conductive traces 241 and second conductive traces 242. Alternatively, connecting layer 62 can fill through-hole 401. In this case, plated through-hole 402 is a metal post and there is no space for an insulative filler in through-hole 401.

First conductive traces 241 and second conductive traces 242 are shown in cross-section as continuous circuit traces for convenience of illustration. That is, first and second conductive traces 241, 242 can provide horizontal signal routing in both the X and Y directions and vertical (top to bottom) routing through first and second via openings 221, 222, respectively. Furthermore, first conductive traces 241 serve as electrical connections for semiconductor chip 110, flange 18 and plated through-hole 402 and second conductive traces 242 serve as electrical connections for bump 16 and plated through-hole 402.

FIG. 5G is a cross-sectional view of the structure showing third dielectric layer 261 disposed on first conductive traces 241 and first dielectric layer 211. Also shown in FIG. 5G is fourth dielectric layer 262 disposed on second conductive traces 242 and second dielectric layer 212. Third dielectric layer 261 and fourth dielectric layer 262 extend into plated through-hole 402 in the vertical direction and fill the remaining space in through-hole 401. Like first and second dielectric layers 211, 212, third and fourth dielectric layers 261, 262 can be epoxy resin, glass-epoxy, polyimide and the like deposited by numerous techniques including film lamination, spin coating, roll coating, and spray-on deposition and have a thickness of 50 microns. Preferably, first dielectric layer 211, second dielectric layer 212, third dielectric layer 261 and fourth dielectric layer 262 are the same material with the same thickness formed in the same manner.

FIG. 5H is a cross-sectional view of the structure with through-hole 403. Through-hole 403 corresponds to and is axially aligned with and concentrically positioned within another subset of first and second openings 181, 361 respectively in flange 18 and conductive layer 36, and extends through third dielectric layer 261, first dielectric layer 211, flange 18, adhesive 30, substrate 34, conductive layer 36, second dielectric layer 212 and fourth dielectric layer 262 in the vertical direction. Through-hole 403 is formed by mechanical drilling and can be formed by other techniques such as laser drilling and plasma etching with or without wet etching.

FIG. 5I is a cross-sectional view of the structure showing third via openings 281 and fourth via openings 282 respectively formed through third dielectric layer 261 and fourth dielectric layer 262 to expose selected portions of first conductive traces 241 and second conductive traces 242. Like first and second via openings 221, 222, third and fourth via openings 281, 282 can be formed by numerous techniques including laser drilling, plasma etching and photolithography and have a diameter of 50 microns. Preferably, first, second, third and fourth via openings 221, 222, 281, 282 are formed in the same manner and have the same size.

Referring now to FIG. 5J, third conductive traces 291 are formed on second dielectric layer 261. Third conductive traces 291 extend from third dielectric layer 261 in the upward direction, extend laterally on third dielectric layer 261 and extend into third via openings 281 in the downward direction to make electrical contact with first conductive traces 241. Also shown in FIG. 5J, fourth conductive traces 292 are formed on fourth dielectric layer 262. Fourth conductive traces 292 extend from fourth dielectric layer 262 in the downward direction, extend laterally on fourth dielectric layer 262 and extend into fourth via openings 282 in the upward direction to make electrical contact with second conductive traces 242.

Third conductive traces 291 and fourth conductive traces 292 can be respectively deposited as a third conductive layer and a fourth conductive layer by numerous techniques including electrolytic plating, electroless plating, sputtering, and their combinations and then patterned by numerous techniques including wet etching, electro-chemical etching, laser-assist etching, and their combinations with an etch mask (not shown) thereon that defines third and fourth conductive traces 291, 292. Preferably, first, second, third and fourth conductive traces 241, 242, 291, 292 are the same material with the same thickness formed in the same manner.

Also as shown in FIG. 5J, connecting layer 65 is deposited in through-hole 403 to provide plated through-hole 404. Connecting layer 65 can be deposited by the same activator solution, electroless copper seeding layer and electroplated copper layer as third and fourth conductive traces 291, 292. Preferably, connecting layer 65, third conductive traces 291 and fourth conductive traces 292 are the same material deposited simultaneously in the same manner and have the same thickness.

Connecting layer 65 is a hollow tube that covers the inner sidewall of through-hole 403 in lateral directions and extends vertically to electrically connect third conductive traces 291 and fourth conductive traces 292. Alternatively, connecting layer 65 can fill through-hole 403. In this case, plated through-hole 404 is a metal post and there is no space for an insulative filler in through-hole 403.

At this stage, as shown in FIG. 5J, stackable semiconductor assembly 100 includes thermal board 101, semiconductor chip 110, die attach 113, first build-up circuitry 201, second build-up circuitry 201' and plated through-holes 402, 404. Thermal board 101 includes adhesive 30, substrate 34 and heat spreader 50. Heat spreader 50 includes bump 16 and flange 18. First build-up circuitry 201 includes first dielectric layer 211, first conductive traces 241, third dielectric layer 261 and third conductive traces 291, while second build-up circuitry 201' includes second dielectric layer 212, second conductive traces 242, fourth dielectric layer 262 and fourth conductive traces 292. Furthermore, plated through-holes 402, 404 are essentially shared by thermal board 101 and first and second build-up circuitries 201, 201'.

Bump 16 is adjacent to flange 18 at bent corner 22, is adjacent to second dielectric layer 212 at bent corner 24 and at floor 28, extends from second dielectric layer 212 in the upward direction, extends from flange 18 in the downward direction and is integral with flange 18. Bump 16 extends into and remains centrally located within opening 32 and aperture 40, and is coplanar at its bottom with an adjacent portion of adhesive 30 that contacts second dielectric layer 212. Bump 16 also contacts adhesive 30, is spaced from substrate 34 and retains its cut-off pyramidal shape in which its dimension increases as it extends upwardly from second dielectric layer 212 to flange 18. Adhesive 30 contacts and is sandwiched between and fills the space between bump 16 and substrate 34 in gap 42, contacts substrate 34 and flange 18 outside gap 42, contacts second dielectric layer 212 and contacts connecting layers 62 and 65. Adhesive 30 extends between bump 16 and flange 18, extends between bump 16 and second dielectric layer 212, is sandwiched between flange 18 and second dielectric layer 212, and is sandwiched between flange 18 and substrate 34. Adhesive 30 also extends laterally from bump 16 to peripheral edges of the assembly and is solidified. Adhesive 30 covers and surrounds tapered sidewall 26 of bump 16 in the lateral directions, covers second dielectric layer 212 outside the periphery of bump 16 in the upward direction, covers substrate 34 in the upward direction and covers flange 18 in the downward direction. Adhesive 30 has a first thickness where it is adjacent to the flange 18 and a second thickness where it is adjacent to the bump 16 that is different from the first thickness.

Plated through-hole 402 is spaced from heat spreader 50 and third and fourth conductive traces 291, 292 and extends vertically from first conductive traces 241 to second conductive traces 242 through first dielectric layer 211, flange 18, adhesive 30, substrate 34, conductive layer 36 and second dielectric layer 212 in an electrically conductive path between first conductive traces 241 and second conductive traces 242. Meanwhile, plated through-hole 404 is spaced from heat spreader 50 and first and second conductive traces 241, 242 and extends vertically from third conductive traces 291 to fourth conductive traces 292 through third dielectric layer 261, first dielectric layer 211, flange 18, adhesive 30, substrate 34, conductive layer 36, second dielectric layer 212 and fourth dielectric layer 262 in an electrically conductive path between third conductive traces 291 and fourth conductive traces 292. Thus, plated through-hole 402 extends from the inner conductive layer of first build-up circuitry 201 to the inner conductive layer of second build-up circuitry 201' and is spaced from the outer conductive layers of first and second build-up circuitries 201, 201', while plated through-hole 404 extends from the outer conductive layer of first build-up circuitry 201 to the outer conductive layer of second build-up circuitry 201' and is spaced from the inner conductive layers of first and second build-up circuitries 201, 201'.

First and second build-up circuitries 201, 201' may include additional interconnect layers (i.e. a fifth dielectric layer with fifth via openings, fifth conductive traces and so on), if desired.

Heat spreader 50 provides heat spreading, heat dissipation, electromagnetic shielding, and a moisture barrier for semiconductor device 110.

FIG. 5K is a cross-sectional view of the structure showing solder mask material 301 disposed on third dielectric layer 261, third conductive traces 291, fourth dielectric layer 262 and fourth conductive traces 292. Solder mask material 301 extends into plated through-hole 404 in the vertical directions and fills the remaining space in through-hole 403. Solder mask material 301 includes solder mask openings 311 that expose selected portions of third conductive traces 291 and fourth conductive traces 292 to define first and second interconnect pads 341, 342. First and second interconnect pads 341, 342 can accommodate a conductive joint, such as solder bump, solder ball, pin, and the like, for electrical communication and mechanical attachment with external components or a PCB. Solder mask openings 311 may be formed by numerous techniques including photolithography, laser drilling and plasma etching.

Figure 6:
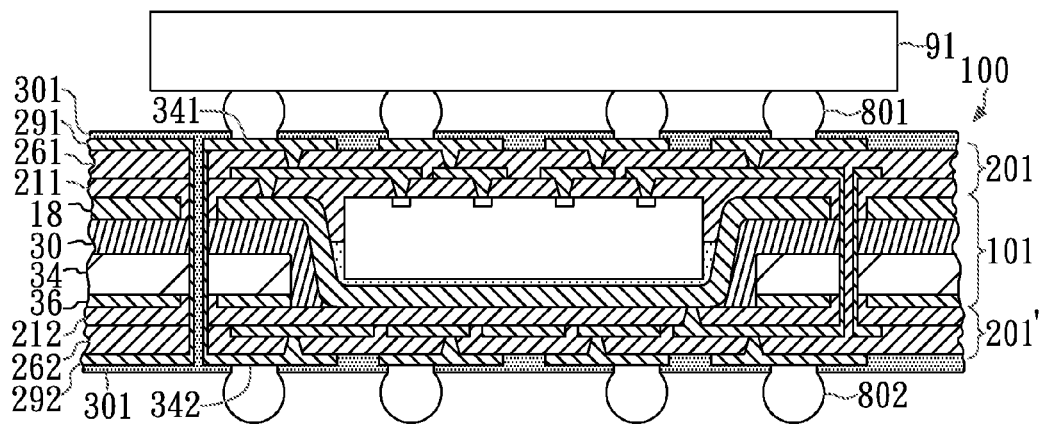
FIG. 6 is a cross-sectional view showing a three dimensional stacked structure that includes a stackable semiconductor assembly and a semiconductor device attached to the first build-up circuitry in accordance with an embodiment of the present invention.

FIG. 6 is a cross-sectional view showing a three dimensional stacked structure in which another semiconductor device 91 is attached to stackable semiconductor assembly 100 at first build-up circuitry 201 via solder bumps 801 on first interconnect pads 341. In addition, stackable assembly 100 can be attached to a printed circuit board or another semiconductor device (not shown) at second build-up circuitry 201' via solder bumps 802 on second interconnect pads 342. Solder bumps 801, 802 can be provided by numerous techniques including screen printing solder paste followed by a reflow process or by electroplating.

Figure 7:
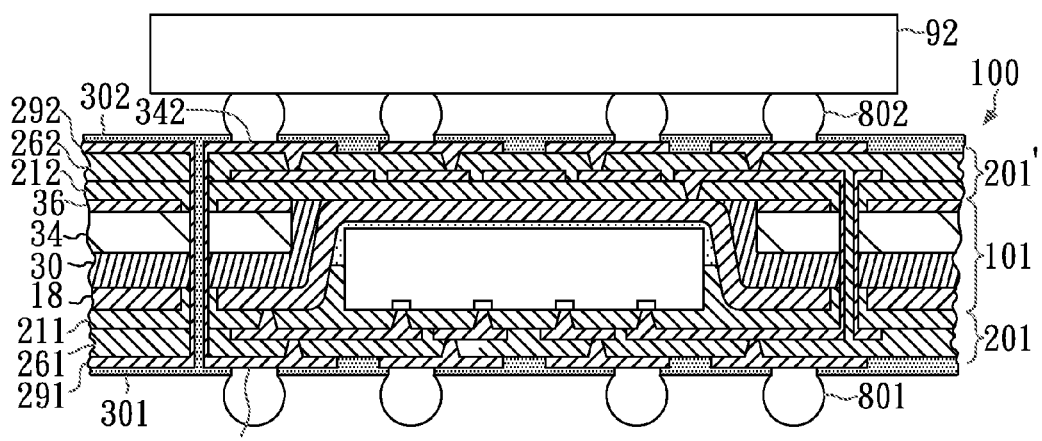
FIG. 7 is a cross-sectional view showing a three dimensional stacked structure that includes a stackable semiconductor assembly and a semiconductor device attached to the second build-up circuitry in accordance with an embodiment of the present invention.

FIG. 7 is a cross-sectional view showing another three dimensional stacked structure in which another semiconductor device 92 is attached to stackable semiconductor assembly 100 at second build-up circuitry 201' via solder bumps 802 on second interconnect pads 342. In addition, stackable assembly 100 can be attached to a printed circuit board or another semiconductor device (not shown) at first build-up circuitry 201 via solder bumps 801 on first interconnect pads 341.

Build-up circuitries 201, 201' may include additional interconnect layers so that first and second interconnect pads 341, 342 are in an appropriate position.

[Embodiment 2]

FIGS. 8A-8H are cross-sectional views showing a method of making a stackable semiconductor assembly with a plated through-hole connected to inner pads of the thermal board according to another aspect of the present invention.

Figure 8A:
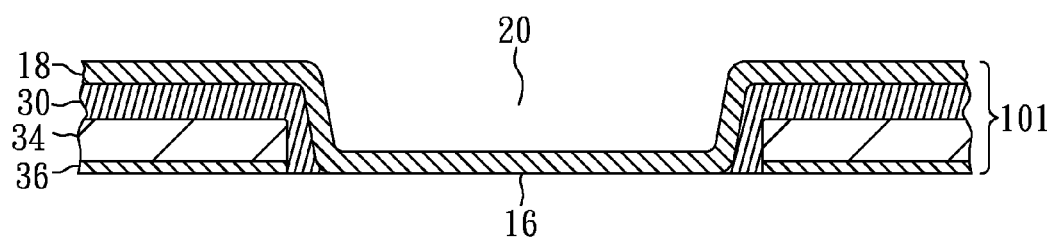
FIGS. 8A-8H are cross-sectional views showing a method of making a stackable semiconductor assembly with a plated through-hole connected to inner pads at both sides of the thermal board in accordance with yet another embodiment of the present invention.

FIG. 8A is a cross-sectional view of thermal board 101, which is manufactured by the steps shown in FIGS. 1A-4E.

Figure 8B:
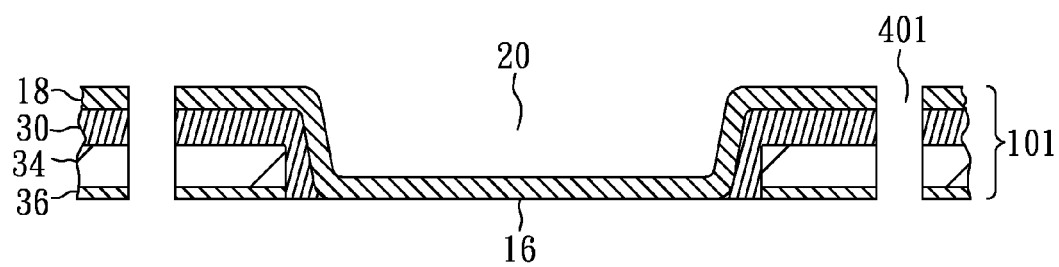

FIG. 8B is a cross-sectional view of the structure with through-holes 401. Through-holes 401 extend through flange 18, adhesive 30, substrate 34 and conductive layer 36 in the vertical direction. Through-holes 401 are formed by mechanical drilling and can be formed by other techniques such as laser drilling and plasma etching.

Figure 8C:
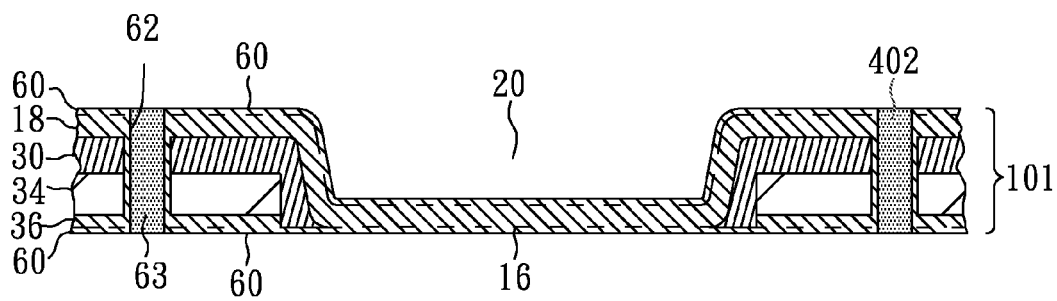

FIG. 8C is a cross-sectional view of the structure with first plated layer 60 outside through-hole 401 and connecting layer 62 and insulative filler 63 in through-hole 401. First plated layer 60 covers and extends from bump 16 and flange 18 in the upward direction. First plated layer 60 also covers and extends from bump 16, adhesive 30 and conductive layer 36 in the downward direction.

Also shown in FIG. 8C is connecting layer 62 deposited in through-hole 401 to provide plated through-hole 402. Connecting layer 62 is a hollow tube that covers the sidewall of through-hole 401 in lateral directions and extends vertically to electrically connect flange 18 and first plated layer 60 thereon to conductive layer 36 and first plated layer 60 thereon, and insulative filler 63 fills the remaining space in through-hole 401. Alternatively, connecting layer 62 can fill through-hole 401 in which case plated through-hole 402 is a metal post and there is no space for an insulative filler in through-hole 401.

Bump 16, flange 18, first plated layer 60, conductive layer 36 and connecting layer 62 are shown as a single layer for convenience of illustration. The boundary (shown in phantom) between the metal layers may be difficult or impossible to detect since copper is plated on copper. However, the boundary between adhesive 30 and first plated layer 60, between adhesive 30 and connecting layer 62, and between substrate 34 and connecting layer 62 is clear.

Figure 8D:
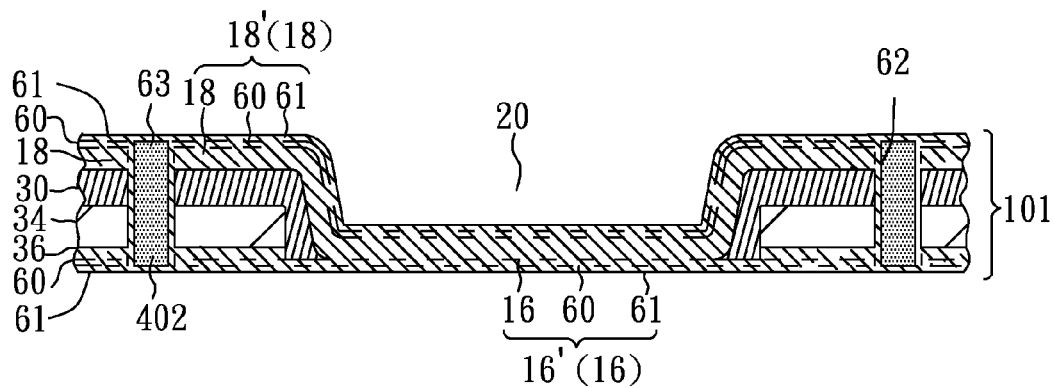

FIG. 8D is a cross-sectional view of the structure with second plated layer 61 deposited on first plated layer 60 and insulative filler 63. Second plated layer 61 is an unpatterned copper layer that covers and extends from first plated layer 60 and insulative filler 63 in the upward and downward directions.

Bump 16, flange 18, first plated layer 60, second plated layer 61, conductive layer 36 and connecting layer 62 are shown as a single layer for convenience of illustration. As the boundary (shown in phantom) between the metal layers may be difficult or impossible to detect since copper is plated on copper, the thickened bump 16' and the thickened flange 18' are considered bump 16 and flange 18 for convenience of illustration. However, the boundary between second plated layer 61 and insulative filler 63, between connecting layer 62 and adhesive 30, between connecting layer 62 and substrate 34 and between connecting layer 62 and insulative filler 63 is clear.

Figure 8E:
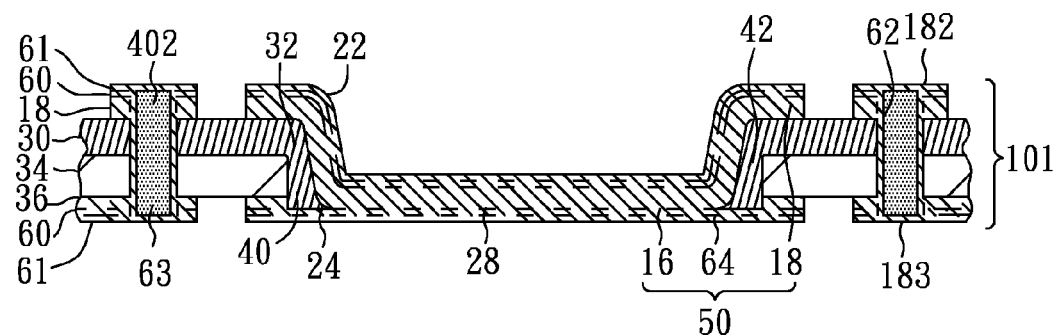

FIG. 8E is a cross-sectional view of the structure showing first inner pad 182 formed on plated through-hole 402 by selective patterning of flange 18, first plated layer 60 and second plated layer 61 on the upper surface via photolithography and wet etching. First inner pad 182 is adjacent to and electrically connected to plated through-hole 402, extends laterally from plated through-hole 402, covers plated through-hole 402 in the upward direction and is spaced from bump 16 and flange 18. Also shown in FIG. 8E are base 64 and second inner pad 183 formed by selective patterning of second plated layer 61, first plated layer 60 and conductive layer 36 on the lower surface via photolithography and wet etching. Base 64 is adjacent to bump 16 and contacts adhesive 30 and substrate 34. Second inner pad 183 is spaced from base 64 and bump 16, and is adjacent to and electrically connected to plated through-hole 402.

At this stage, as shown in FIG. 8E, thermal board 101 includes adhesive 30, substrate 34, heat spreader 50, first inner pads 182, second inner pads 183 and plated through-holes 402. Heat spreader 50 includes bump 16, flange 18 and base 64.

Bump 16 is adjacent to flange 18 at bent corner 22, is adjacent to base 64 at bent corner 24 and at floor 28, extends from base 64 in the upward direction, extends from flange 18 in the downward direction and is integral with flange 18. Bump 16 extends into and remains centrally located within opening 32 and aperture 40, and is coplanar at its bottom with an adjacent portion of adhesive 30 that contacts base 64. Bump 16 also contacts adhesive 30, is spaced from substrate 34 and retains its cut-off pyramidal shape in which its dimension increases as it extends upwardly from base 64 to flange 18.

Base 64 is adjacent to bump 16, extends laterally beyond opening 32 and aperture 40 and covers bump 16, opening 32 and aperture 40 in the downward direction. Base 64 contacts adhesive 30 and substrate 34 and extends beyond adhesive 30 and substrate 34 in the downward direction. Base 64 has a first thickness (i.e. a combined thickness of first plated layer 60 and second plated layer 61) where it is adjacent to bump 16, a second thickness (i.e. a combined thickness of conductive layer 36, first plated layer 60 and second plated layer 61) where it is adjacent to substrate 34 that is larger than the first thickness and a flat surface that faces in the downward direction.

First inner pad 182 extends from adhesive 30 in the upward direction, is spaced from flange 18 and is adjacent to and integral with plated through-hole 402. First inner pad 182 and flange 18 have the same thickness and are coplanar with one another at a surface the faces in the upward direction.

Second inner pad 183 extends from substrate 34 in the downward direction, is spaced from base 64 and is adjacent to and integral with plated through-hole 402. Second inner pad 183 has a combined thickness of conductive layer 36, first plated layer 60 and second plated layer 61. Accordingly, base 64 and second inner pad 183 have the same thickness where closest to one another and different thickness where base 64 is adjacent to bump 16 and are coplanar with one another at a surface the faces in the downward direction.

Adhesive 30 contacts and is sandwiched between and fills the space between bump 16 and substrate 34 in gap 42, contacts substrate 34 and flange 18 outside gap 42, contacts base 64 and contacts connecting layer 62. Adhesive 30 extends between bump 16 and flange 18, extends between bump 16 and base 64, is sandwiched between flange 18 and base 64, and is sandwiched between flange 18 and substrate 34. Adhesive 30 also extends laterally from bump 16 to peripheral edges of the assembly and is solidified. Adhesive 30 covers and surrounds tapered sidewall 26 of bump 16 in the lateral directions, covers base 64 outside the periphery of bump 16, and covers substrate 34 and flange 18 in the downward direction. Adhesive 30 has a first thickness where it is adjacent to the flange 18 and a second thickness where it is adjacent to the bump 16 that is different from the first thickness.

Figure 8F:
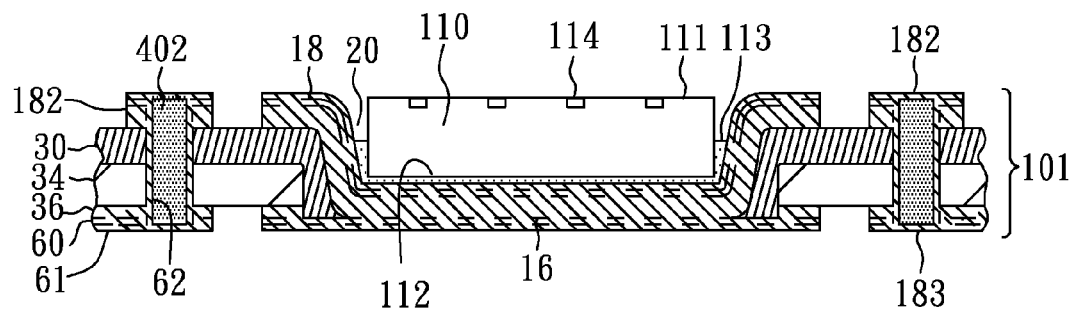

FIG. 8F is a cross-sectional view of the thermal board 101 with semiconductor chip 110 mounted on bump 16 by die attach 113.

Figure 8G:
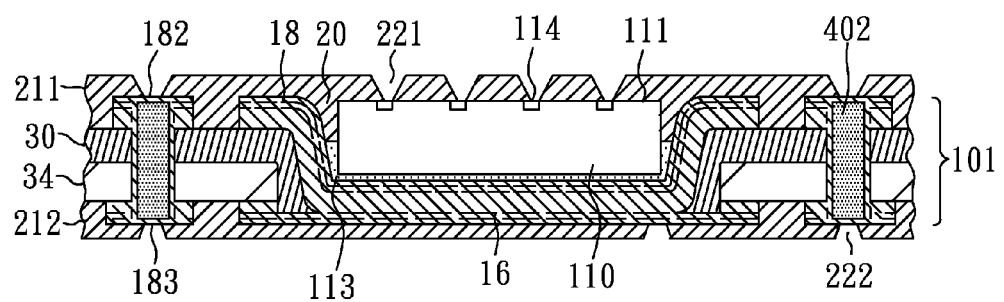

FIG. 8G is a cross-sectional view of the structure with first dielectric layer 211 and second dielectric layer 212 disposed on both surfaces of thermal board 101. First dielectric layer 211 extends beyond semiconductor chip top surface 111 (i.e.

active surface), contact pads 114, die attach 113, bump 16, flange 18, first inner pads 182 and plated through-holes 402 in the upward direction. First dielectric layer 211 extends into cavity 20, thereby contacting bump 16, semiconductor chip 110 and die attach 113, and is sandwiched between bump 16 and semiconductor chip 110. First dielectric layer 211 also contacts flange 18, adhesive 30 and first inner pad 182 outside cavity 20. Second dielectric layer 212 contacts base 64 and second inner pads 183 and extends beyond them in the downward direction. Second dielectric layer 212 extends into a gap between base 64 and second inner pad 183, thereby contacting substrate 34. Also shown in FIG. 8G are first via openings 221 and second via openings 222 respectively formed through first dielectric layer 211 and second dielectric layer 212. First via openings 221 expose contact pads 114 and first inner pads 182, while second via openings 222 expose base 64 and second inner pads 183.

Figure 8H:
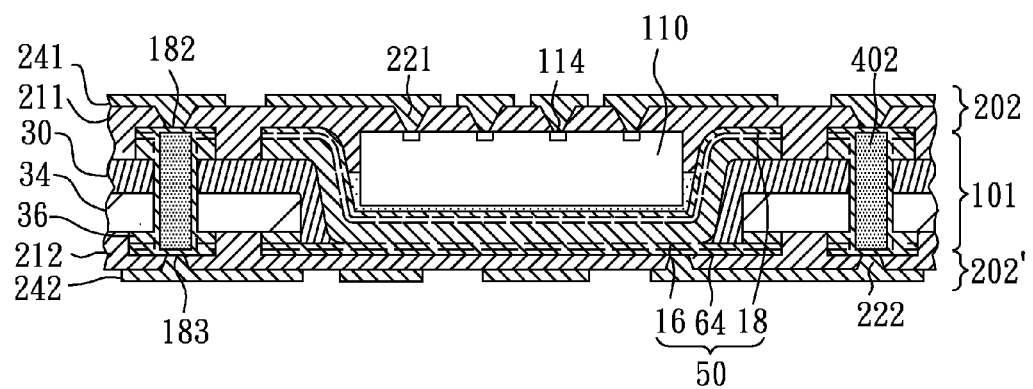

Referring now to FIG. 8H, first conductive traces 241 are formed on first dielectric layer 211. First conductive traces 241 extend from first dielectric layer 211 in the upward direction, extend laterally on first dielectric layer 211 and extend through first via openings 221 in the downward direction to make electrical contact with contact pads 114 and first inner pads 182. Also shown in FIG. 8H are second conductive traces 242 formed on second dielectric layer 212. Second conductive traces 242 extend from second dielectric layer 212 in the downward direction, extend laterally on second dielectric layer 212 and extend through the second via openings 222 in the upward vertical direction to make electrical contact with base 64 and second inner pads 183.

Accordingly, as shown in FIG. 8H, first build-up circuitry 202 includes first dielectric layer 211 and first conductive traces 241, and second build-up circuitry 202' includes second dielectric layer 212 and second conductive traces 242. Thermal board 101 includes adhesive 30, substrate 34, heat spreader 50, first inner pad 182, second inner pad 183 and plated through-hole 402. Heat spreader 50 includes bump 16, flange 18 and base 64. Plated through-hole 402 is spaced from heat spreader 50 and both surfaces of the assembly, and extends from first inner pad 182 to second inner pad 183 through adhesive 30 and substrate 34 in an electrically conductive path between first conductive traces 241 and second conductive traces 242.

[Embodiments 3-4]

Figure 9:
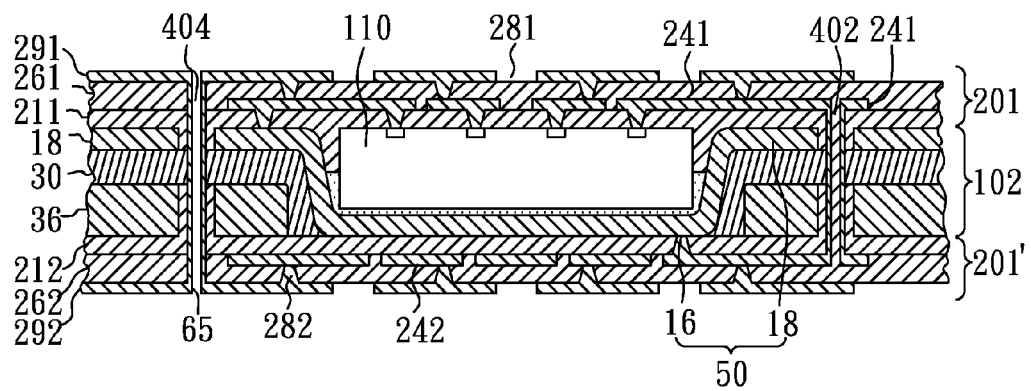
FIGS. 9 and 10 are cross-sectional views showing stackable semiconductor assemblies that include a thermal board without a substrate in accordance with other embodiments of the present invention.
Figure 10:
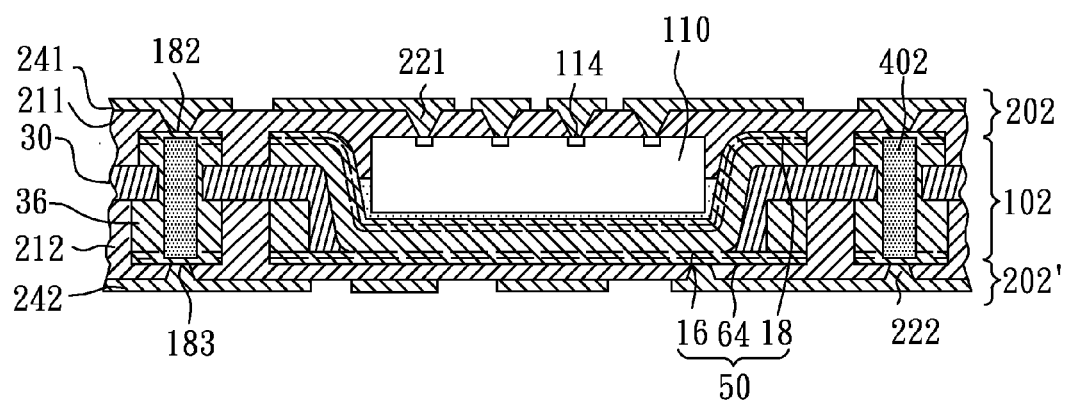

FIGS. 9-10 are cross-sectional views showing stackable semiconductor assemblies wherein the thermal board is devoid of a substrate.

In these embodiments, a thick conductive layer 36 is applied and the substrate is omitted. For instance, conductive layer 36 has a thickness of 130 microns (rather than 30 microns) so that it can be handled without warping or wobbling. If a base is created, as shown in FIG. 10, base 64 and second inner pad 183 are therefore thicker, and thermal board 102 is devoid of a substrate. Accordingly, base 64 has a first thickness where it is adjacent to the bump 16 and a second thickness where it is adjacent to the adhesive 30 that is larger than the first thickness, and base 64 and second inner pad 183 have the same thickness where closest to one another and different thickness where base 64 is adjacent to bump 16 and are coplanar with one another at a surface that faces in the downward direction.

As mentioned above, adhesive 30 can have a first thickness where it is adjacent to flange 18 and a second thickness where it is adjacent to bump 16 that is different from the first thickness. That is, the distance in the vertical directions between flange 18 and conductive layer 36 (being a part of the base 64) can be different from the distance in the lateral directions between bump 16 and conductive layer 36. Furthermore, as mentioned above, as adhesive 30 extends into the gap between bump 16 and conductive layer 36 in the downward direction, adhesive 30 can have an increasing thickness where it is adjacent to bump 16 since bump 16 has an increasing dimension as it extends in the upward direction.

Thermal board 102 can be manufactured in a manner similar to thermal board 101 with suitable adjustments for conductive layer 36. For instance, adhesive 30 is mounted on flange 18, conductive layer 36 alone is mounted on adhesive 30, heat and pressure are applied to flow and solidify adhesive 30 and then grinding is applied to planarize bump 16, adhesive 30 and conductive layer 36 at a lateral surface. Accordingly, adhesive 30 contacts bump 16, flange 18 and conductive layer 36 and laterally covers and surrounds and conformally coats tapered sidewall 26 of bump 16. Plated through-hole 402 extends from first conductive traces 241 to second conductive traces 242 through first dielectric layer 211, flange 18, adhesive 30, conductive layer 36 and second dielectric layer 212 (as shown in FIG. 9), or plated through-hole 404 extends from third conductive traces 291 to fourth conductive traces 292 through third dielectric layer 261, first dielectric layer 211, flange 18, adhesive 30, conductive layer 36, second dielectric layer 212 and fourth dielectric layer 262 (also shown in FIG. 9), or plated through-hole 402 extends from first inner pad 182 to second inner pad 183 through adhesive 30 alone (as shown in FIG. 10).

The semiconductor assemblies and thermal boards described above are merely exemplary. Numerous other embodiments are contemplated. In addition, the embodiments described above can be mixed-and-matched with one another and with other embodiments depending on design and reliability considerations. For instance, the substrate can include ceramic material or epoxy-based laminate, and can have embedded single-level conductive traces or multi-level conductive traces. The thermal board can include multiple bumps arranged in an array for multiple semiconductor devices and the build-up circuitries can include additional conductive traces to accommodate additional semiconductor devices.

The semiconductor device can share or not share the heat spreader with other semiconductor devices. For instance, a single semiconductor device can be mounted on the heat spreader. Alternatively, numerous semiconductor devices can be mounted on the heat spreader. For instance, four small chips in a 2×2 array can be attached to the bump and the build-up circuitries can include additional conductive traces to receive and route additional contact pads. This may be more cost effective than providing a miniature bump for each chip.

The semiconductor device can be a packaged or unpackaged chip. Furthermore, the semiconductor device can be a bare chip, LGA, or QFN, etc. The semiconductor device can be mechanically, electrically and thermally connected to the thermal board using a wide variety of connection media including solder and electrically and/or thermally conductive die attach.

The heat spreader can provide rapid, efficient and essentially uniform heat spreading and dissipation for the semiconductor device to the next level assembly. The heat spreader can also provide effective electromagnetic shielding and a moisture barrier for the semiconductor device. The heat spreader can include a bump and a flange that are integral with one another. Furthermore, the bump can be customized for the semiconductor device. For instance, the bump can have a square or rectangular shape at its floor with the same or similar topography as the thermal contact of the semiconductor device. In any case, the heat spreader can be a wide variety of thermally conductive metallic structures.

The bump and flange can be a thermally conductive metal plate such as copper with a thickness of 100-300 microns, which is much thicker than typical circuitry (~18 microns). In addition, the flange can be thermally connected to an outer conductive layer of the build-up circuitry by metallized thermal vias that serve as heat pipes. For instance, the flange can be thermally connected to the outer layer of the first build-up circuitry by first and third conductive traces in first and third via openings or by plated through-holes that extend through the first and third dielectric layers.

The flange can also be thermally connected to the outer layer of the second build-up circuitry by plated through-holes that extend through the adhesive, the substrate, the conductive layer and the second and fourth dielectric layers. In this manner, the flange can enhance the thermal performance of the heat spreader.

A heat spreader that includes a post, a base, an underlayer and a thermal via in which the thermal via extends from the base through a support layer to the underlayer is disclosed in U.S. application Ser. No. 13/111,966 filed May 20, 2011 by Charles W. C. Lin et al. entitled "Semiconductor Chip Assembly with Post/Base Heat Spreader with Thermal Via" which is incorporated by reference.

The heat spreader can be electrically connected to or isolated from the semiconductor device. For instance, the first conductive traces extending into the first via openings above the contact pads and the flange can electrically connect the semiconductor device to the flange. Thereafter, the heat spreader can be electrically connected to ground, thereby electrically connecting the semiconductor device to ground and providing electromagnetic shielding for the semiconductor device.

The adhesive can provide a robust mechanical bond between the heat spreader and the substrate. For instance, the adhesive can extend laterally from the bump beyond the conductive traces to the peripheral edges of the assembly, the adhesive can fill the space between the heat spreader and the substrate and the adhesive can be void-free with consistent bond lines. The adhesive can also absorb thermal expansion mismatch between the heat spreader and the substrate. The adhesive can also be the same material as or a different material than the substrate and the dielectric layers. Furthermore, the adhesive can be a low cost dielectric that need not have high thermal conductivity. Moreover, the adhesive is not prone to delamination.

The adhesive thickness can be adjusted so that the adhesive essentially fills the gap and essentially all the adhesive is within structure once it is solidified and/or grinded. For instance, the optimal prepreg thickness can be established through trial and error.

The substrate can provide critical mechanical support for the thermal board. For instance, the substrate can prevent the thermal board from warping during metal grinding, chip mounting and build-up circuitry formation. The substrate can be a low cost material that need not have high thermal conductivity. Accordingly, the substrate can be made of conventional organic materials such as epoxy, glass-epoxy, polyimide, etc. The substrate can also be made of thermally conductive materials such as aluminum oxide ($Al_2O_3$), aluminum nitride (AlN), silicon nitride (SiN), silicon (Si), etc. The substrate can be a single layer structure or a multi-layer structure such as a laminated circuit board or a multi-layer ceramic board. Accordingly, the substrate can include additional layers of embedded circuitry.

The conductive layer can be provided on the substrate, then the aperture can be formed in the conductive layer and the substrate, and then the conductive layer and the substrate can be mounted on the adhesive so that the conductive layer is exposed in the upward direction, the substrate contacts and is sandwiched between and separates the conductive layer and the adhesive, and the bump extends into and is exposed in the upward direction by the aperture. In this instance, the conductive layer can have a thickness of 10 to 50 microns such as 30 microns which is thick enough for reliable signal transfer yet thin enough to reduce weight and cost. Furthermore, the substrate is a permanent part of the thermal board.

The conductive layer alone can be mounted on the adhesive. For instance, the aperture can be formed in the conductive layer and then the conductive layer can be mounted on the adhesive so that the conductive layer contacts the adhesive and is exposed in the upward direction and the bump extends into and is exposed in the upward direction by the aperture. In this instance, the conductive layer can have a thickness of 100 to 200 microns such as 125 microns which is thick enough to handle without warping and wobbling yet thin enough to pattern without excessive etching.

The conductive layer and a carrier can be mounted on the adhesive. For instance, the conductive layer can be attached to a carrier such biaxially-oriented polyethylene terephthalate polyester (Mylar) by a thin film, then the aperture can be formed in the conductive layer but not the carrier, then the conductive layer and the carrier can be mounted on the adhesive so that the carrier covers the conductive layer and is exposed in the upward direction, the thin film contacts and is sandwiched between the carrier and the conductive layer, the conductive layer contacts and is sandwiched between the thin film and the adhesive, and the bump is aligned with the aperture and covered in the upward direction by the carrier. After the adhesive is solidified, the thin film can be decomposed by UV light so that the carrier can be peeled off the conductive layer, thereby exposing the conductive layer in the upward direction, and then the conductive layer can be grinded and patterned for the base and the terminal. In this instance, the conductive layer can have a thickness of 10 to 50 microns such as 30 microns which is thick enough for reliable signal transfer yet thin enough to reduce weight and cost, and the carrier can have a thickness of 300 to 500 microns which is thick enough to handle without warping and wobbling yet thin enough to reduce weight and cost. Furthermore, the carrier is a temporary fixture and not a permanent part of the thermal board.

The first and/or second build-up circuitry can function as a signal, power or ground layer depending on the purpose of the corresponding semiconductor device pad. The conductive traces can also include various conductive metals such as copper, gold, nickel, silver, palladium, tin, combinations thereof, and alloys thereof. The preferred composition will depend on the nature of the external connection media as well as design and reliability considerations. Furthermore, those skilled in the art will understand that in the context of a semiconductor assembly, the copper material can be pure elemental copper but is typically a copper alloy that is mostly copper such as copper-zirconium (99.9% copper), copper-silver-phosphorus-magnesium (99.7% copper) and copper-tin-iron-phosphorus (99.7% copper) to improve mechanical properties such as tensile strength and elongation.

The substrate and plated layers and solder mask material and additional build-up layers are generally desirable but may be omitted in some embodiments. For instance, if a thick conductive layer is needed then the substrate may be omitted to reduce cost. Likewise, if the first conductive traces provide the necessary signal routing between the semiconductor device and the plated through-hole then the third conductive traces can be omitted.

The working format for the thermal board can be a single thermal board or multiple thermal boards based on the manufacturing design. For instance, a single thermal board can be manufactured individually. Alternatively, numerous thermal boards can be simultaneously batch manufactured using a single metal plate, a single adhesive, a single substrate, a single conductive layer and a single plated layer and then separated from one another. Likewise, numerous sets of heat spreaders and conductive traces that are each dedicated to a single semiconductor device can be simultaneously batch manufactured for each thermal board in the batch using a single metal plate, a single adhesive, a single substrate, a single conductive layer and a single plated layer.

For example, multiple bumps can be stamped in the metal plate, then the non-solidified adhesive with openings corresponding to the bumps can be mounted on the flange such that each bump extends through an opening, then the substrate and the conductive layer (with apertures corresponding to the bumps) can be mounted on the adhesive such that each bump extends through an opening into an aperture, then the flange and the substrate can be moved towards one another by platens to force the adhesive into the gaps in the apertures between the bumps and the substrate, then the adhesive can be cured and solidified and then the bumps, the adhesive and the conductive layer can be grinded to form a lateral surface.

The working format for the semiconductor assembly can be a single assembly or multiple assemblies based on the manufacturing design. For instance, a single assembly can be manufactured individually. Alternatively, numerous assemblies can be simultaneously batch manufactured before the thermal boards are separated from one another. Likewise, multiple semiconductor devices can be electrically, thermally and mechanically connected to each thermal board in the batch.

The thermal boards can be detached from one another in a single step or multiple steps. For instance, the thermal boards can be batch manufactured as a panel, then the semiconductor devices can be mounted on the panel and then the semiconductor assemblies of the panel can be detached from one another. Alternatively, the thermal boards can be batch manufactured as a panel, then the thermal boards of the panel can be singulated into strips of multiple thermal boards, then the semiconductor devices can be mounted on the thermal boards of a strip and then the semiconductor assemblies of the strip can be detached from one another. Furthermore, the thermal boards can be detached by mechanical sawing, laser sawing, cleaving or other suitable techniques.

The term "adjacent" refers to elements that are integral (single-piece) or in contact (not spaced or separated from) with one another. For instance, the bump is adjacent to the base and the flange but not the substrate.

The term "overlap" refers to above and extending within a periphery of an underlying element. Overlap includes extending inside and outside the periphery or residing within the periphery. For instance, in the cavity-up position, the semiconductor device overlaps the bump since an imaginary vertical line intersects the semiconductor device and the bump, regardless of whether another element such as the die attach is between the semiconductor device and the bump and is intersected by the line, and regardless of whether another imaginary vertical line intersects the bump but not the semiconductor device (outside the periphery of the semiconductor device). Likewise, the bump overlaps the base, the flange overlaps the adhesive and the base is overlapped by the bump.

Moreover, overlap is synonymous with over and overlapped by is synonymous with under or beneath.

The term "contact" refers to direct contact. For instance, the substrate contacts the adhesive but does not contact the bump.

The term "cover" refers to complete coverage in a vertical and/or lateral direction. For instance, in the cavity-up position, the base covers the bump in the downward direction but the bump does not cover the base in the upward direction when the base extends laterally beyond the aperture and contacts the substrate.

The term "layer" refers to patterned and un-patterned layers. For instance, the conductive layer can be an unpatterned blanket sheet on the substrate when the laminated structure including the conductive layer and the substrate is mounted on the adhesive, and the first conductive layer can be a patterned circuit with spaced traces on the first dielectric layer when the semiconductor device is mounted on the heat spreader. Furthermore, a layer can include stacked layers.

The terms "opening" and "aperture" and "hole" refer to a through-hole and are synonymous. For instance, in the cavity-down position, the bump is exposed by the adhesive in the upward direction when it is inserted into the opening in the adhesive. Likewise, the bump is exposed by the laminated structure in the upward direction when it is inserted into the aperture in the laminated structure.

The term "inserted" refers to relative motion between elements. For instance, the bump is inserted into the aperture regardless of whether the flange is stationary and the substrate moves towards the flange, the substrate is stationary and the flange moves towards the substrate or the flange and the substrate both approach the other. Furthermore, the bump is inserted (or extends) into the aperture regardless of whether it goes through (enters and exits) or does not go through (enters without exiting) the aperture.

The phrase "move towards one another" also refers to relative motion between elements. For instance, the flange and the substrate move towards one another regardless of whether the flange is stationary and the substrate moves towards the flange, the substrate is stationary and the flange moves towards the substrate or the flange and the substrate both approach the other.

The phrase "aligned with" refers to relative position between elements. For instance, the bump is aligned with the aperture when the adhesive is mounted on the flange, the substrate and the conductive layer are mounted on the adhesive, the bump is inserted into and aligned with the opening and the aperture is aligned with the opening regardless of whether the bump is inserted into the aperture or is below and spaced from the aperture.

The phrase "mounted on" includes contact and non-contact with a single or multiple support element(s). For instance, the semiconductor device is mounted on the bump regardless of whether it contacts the bump or is separated from the bump by a die attach.

The phrase "adhesive . . . in the gap" refers to the adhesive in the gap. For instance, adhesive that extends across the substrate in the gap refers to the adhesive in the gap that extends across the substrate. Likewise, adhesive that contacts and is sandwiched between the bump and the substrate in the gap refers to the adhesive in the gap that contacts and is sandwiched between the bump at the inner sidewall of the gap and the substrate at the outer sidewall of the gap.

The phrase "the base extends laterally from the bump" refers to lateral extension where the base is adjacent to the bump. For instance, in the cavity-up position, the base extends laterally from the bump when it contacts the adhesive regardless of whether it extends laterally beyond the bump, extends laterally to the flange or covers the bump in the downward direction. Likewise, the base does not extend laterally beyond the bump when it is coextensive with the bump at its floor.

The phrase "electrical connection", "electrically connected" or "electrically connecting" refers to direct and indirect electrical connection. For instance, the plated through-hole provides an electrical connection for first conductive trace regardless of whether it is adjacent to the first conductive trace or electrically connected to the first conductive trace by the third conductive trace.

The term "above" refers to upward extension and includes adjacent and non-adjacent elements as well as overlapping and non-overlapping elements. For instance, in the cavity-up position, the bump extends above, is adjacent to, overlaps and protrudes from the base.

The term "below" refers to downward extension and includes adjacent and non-adjacent elements as well as overlapping and non-overlapping elements. For instance, in the cavity-up position, the base extends below, is adjacent to and is overlapped by the bump and protrudes from the bump in the downward direction. Likewise, the bump extends below the substrate even though it is not adjacent to or overlapped by the substrate.

The "first vertical direction" and "second vertical direction" do not depend on the orientation of the semiconductor assembly (or the thermal board), as will be readily apparent to those skilled in the art. For instance, the bump extends vertically beyond the base in the first vertical direction and vertically beyond the flange in the second vertical direction regardless of whether the assembly is inverted and/or mounted on a heat sink. Likewise, the flange extends "laterally" from the bump in a lateral plane regardless of whether the assembly is inverted, rotated or slanted. Thus, the first and second vertical directions are opposite one another and orthogonal to the lateral directions, and laterally aligned elements are coplanar with one another at a lateral plane orthogonal to the first and second vertical directions. Furthermore, the first vertical direction is the upward direction and the second vertical direction is the downward direction in the cavity-up position, and the first vertical direction is the downward direction and the second vertical direction is the upward direction in the cavity-down position.

The stackable semiconductor assembly of the present invention has numerous advantages. The assembly is reliable, inexpensive and well-suited for high volume manufacture. The assembly is especially well-suited for high power semiconductor devices and large semiconductor chips as well as multiple semiconductor devices such as small semiconductor chips in arrays which generate considerable heat and require excellent heat dissipation in order to operate effectively and reliably.

The manufacturing process is highly versatile and permits a wide variety of mature electrical, thermal and mechanical connection technologies to be used in a unique and improved manner. The manufacturing process can also be performed without expensive tooling. As a result, the manufacturing process significantly enhances throughput, yield, performance and cost effectiveness compared to conventional packaging techniques. Moreover, the assembly is well-suited for copper chip and lead-free environmental requirements.

The embodiments described herein are exemplary and may simplify or omit elements or steps well-known to those skilled in the art to prevent obscuring the present invention. Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

We claim:

1. A method of making a thermally enhanced stackable semiconductor assembly, comprising:
    providing a bump, a flange, an adhesive and a conductive layer with an aperture, wherein the bump defines a cavity that faces in a first vertical direction, covers the cavity in a second vertical direction opposite the first vertical direction, is adjacent to and integral with the flange and extends from the flange in the second vertical direction, and the flange extends laterally from the bump in lateral directions orthogonal to the vertical directions; then
    attaching the flange and the bump to the conductive layer via the adhesive between the flange and the conductive layer and between the bump and the conductive layer, including aligning the bump with the aperture; then
    mounting a semiconductor device that includes a contact pad on the bump at the cavity;
    providing a first build-up circuitry on the semiconductor device and the flange that extends from the semiconductor device and the flange in the first vertical direction and is electrically connected to the semiconductor device;
    providing a second build-up circuitry that extends beyond the bump, the adhesive and the conductive layer in the second vertical direction; and
    providing a plated through-hole that extends through the adhesive in the vertical directions to provide an electrical connection between the first build-up circuitry and the second build-up circuitry.

2. The method of claim 1, wherein providing the bump includes mechanically stamping a metal plate.

3. The method of claim 1, wherein attaching the flange and the bump to the conductive layer includes:
    mounting the adhesive that is non-solidified on the flange, including aligning the bump with an opening of the adhesive;
    mounting the conductive layer on the adhesive, including aligning the bump with the aperture of the conductive layer, wherein the adhesive is sandwiched between the flange and the conductive layer; then
    flowing the adhesive into a gap located in the aperture between the bump and the conductive layer; and
    solidifying the adhesive.

4. The method of claim 3, wherein:
    flowing the adhesive into the gap includes applying heat to melt the adhesive, and moving the flange and the conductive layer towards one another, thereby moving the bump in the second vertical direction in the aperture and applying pressure to the molten adhesive between the flange and the conductive layer, wherein the pressure forces the molten adhesive to flow in the second vertical direction into the gap located in the aperture between the bump and the conductive layer; and
    solidifying the adhesive includes applying heat to solidify the molten adhesive, thereby mechanically attaching the bump and the flange to the conductive layer.

5. The method of claim 3, wherein:
    providing the adhesive includes providing a prepreg with uncured epoxy;

flowing the adhesive includes melting the uncured epoxy and compressing the uncured epoxy between the flange and the conductive layer; and solidifying the adhesive includes curing the uncured epoxy.

6. The method of claim 3, wherein flowing the adhesive includes filling the gap with the adhesive and forcing the adhesive beyond the bump and the conductive layer in the second vertical direction such that the adhesive contacts surfaces of the bump and the conductive layer that face in the second vertical direction.

7. The method of claim 3, wherein mounting the conductive layer includes mounting the conductive layer alone on the adhesive such that the conductive layer contacts the adhesive and the aperture extends through the conductive layer alone.

8. The method of claim 3, wherein mounting the conductive layer includes mounting a laminated structure that includes the conductive layer and a substrate on the adhesive such that the substrate contacts and is sandwiched between the conductive layer and the adhesive, the conductive layer is spaced from the adhesive and the aperture extends through the conductive layer and the substrate.

9. The method of claim 1, wherein providing the first build-up circuitry and the second build-up circuitry includes:

providing a first dielectric layer on the semiconductor device and the flange that extends from the semiconductor device and the flange in the first vertical direction and includes a first via opening that is aligned with the contact pad;

providing a second dielectric layer that extends beyond the bump, the adhesive and the conductive layer in the second vertical direction;

providing a first conductive trace on the first dielectric layer that extends from the first dielectric layer in the first vertical direction, extends laterally on the first dielectric layer and extends through the first via opening in the second vertical direction to the contact pad, thereby electrically connecting the semiconductor device to the first conductive trace; and providing a second conductive trace on the second dielectric layer that extends from the second dielectric layer in the second vertical direction and extends laterally on the second dielectric layer.

10. The method of claim 9, wherein providing the first conductive trace and the second conductive trace includes:

depositing a first plated layer on the first dielectric layer that extends through the first via opening to the contact pad;

depositing a second plated layer on the second dielectric layer;

removing selected portions of the first plated layer to define the first conductive trace; and removing selected portions of the second plated layer to define the second conductive trace.

11. The method of claim 10, comprising simultaneously depositing the first dielectric layer and the second dielectric layer and then simultaneously depositing the first plated layer and the second plated layer.

12. The method of claim 9, wherein providing the first dielectric layer, the second dielectric layer, the first conductive trace, the second conductive trace and the plated through-hole includes:

forming a through-hole that extends through the adhesive in the vertical directions; then depositing a connecting layer on an inner sidewall of the through-hole;

depositing an inner plated layer on the bump and flange in the first vertical direction and on the bump, the adhesive and the conductive layer in the second vertical direction; then removing selected portions of the flange and the inner plated layer in the first vertical direction to define a first inner pad such that the first inner pad is adjacent to the connecting layer and spaced from the flange;

removing selected portions of the conductive layer and the inner plated layer in the second vertical direction to define a base and a second inner pad wherein the base is adjacent to the bump, extends from and covers the bump in the second vertical direction and extends laterally from the bump, includes a selected portion of the conductive layer that is adjacent to the aperture and spaced from the bump and includes a selected portion of the inner plated layer that is adjacent to the bump, the adhesive and the conductive layer, and the second inner pad is adjacent to the connecting layer and spaced from the bump and the base, extends beyond the adhesive in the second vertical direction, includes a selected portion of the conductive layer that is spaced from the aperture and the bump and includes a selected portion of the inner plated layer that is adjacent to the conductive layer and spaced from the bump and the adhesive; then depositing the first dielectric layer on the semiconductor device, the flange and the first inner pad;

depositing the second dielectric layer on the base and the second inner pad; then forming the first via opening and an additional first via opening in the first dielectric layer, wherein the additional first via opening is aligned with and exposes the first inner pad;

forming a second via opening in the second dielectric layer that is aligned with and exposes the second inner pad; then depositing a first plated layer on the first dielectric layer that extends through the first via opening to the contact pad and extends through the additional first via opening to the first inner pad;

depositing a second plated layer on the second dielectric layer that extends through the second via opening to the second inner pad; then removing selected portions of the first plated layer to define the first conductive trace; and removing selected portions of the second plated layer to define the second conductive trace.

13. The method of claim 9, wherein providing the first dielectric layer, the second dielectric layer, the first conductive trace, the second conductive trace and the plated through-hole includes:

depositing the first dielectric layer on the semiconductor device and the flange;

depositing the second dielectric layer on the bump, the adhesive and the conductive layer; then forming the first via opening in the first dielectric layer;

depositing a first plated layer on the first dielectric layer that extends through the first via opening to the contact pad;

depositing a second plated layer on the second dielectric layer;

removing selected portions of the first plated layer to define the first conductive trace;

removing selected portions of the second plated layer to define the second conductive trace;

forming a through-hole that extends through the adhesive, the first dielectric layer and the second dielectric layer in the vertical directions; and depositing a connecting layer on an inner sidewall of the through-hole to provide an electrical connection between the first conductive trace and the second conductive trace.

14. The method of claim 9, comprising:

forming an additional first via opening that extends through the first dielectric layer and is aligned with and exposes the flange; and then providing the first conductive trace that extends through the additional first via opening in the second vertical direction, thereby electrically connecting the flange to the first conductive trace.

15. The method of claim 9, comprising:

forming a second via opening that extends through the second dielectric layer and is aligned with the bump; and then providing the second conductive trace that extends through the second via opening in the first vertical direction, thereby electrically connecting the bump to the second conductive trace.

16. The method of claim 1, comprising providing the plated through-hole during providing the first build-up circuitry and the second build-up circuitry or before mounting the semiconductor device and after attaching the flange and the bump to the conductive layer.

17. The method of claim 1, wherein providing the plated through-hole includes:

forming a through-hole that extends through the adhesive in the vertical directions; and then depositing a connecting layer on an inner sidewall of the through-hole.

18. A method of making a thermally enhanced stackable semiconductor assembly, comprising:

providing a bump, a flange, an adhesive and a substrate with an aperture, wherein the bump defines a cavity that faces in a first vertical direction, covers the cavity in a second vertical direction opposite the first vertical direction, is adjacent to and integral with the flange and extends from the flange in the second vertical direction, and the flange extends laterally from the bump in lateral directions orthogonal to the vertical directions; then attaching the flange and the bump to the substrate via the adhesive between the flange and the substrate and between the bump and the substrate, including aligning the bump with the aperture; then mounting a semiconductor device that includes a contact pad on the bump at the cavity;

providing a first build-up circuitry on the semiconductor device and the flange that extends from the semiconductor device and the flange in the first vertical direction and is electrically connected to the semiconductor device;

providing a second build-up circuitry that extends beyond the bump, the adhesive and the substrate in the second vertical direction; and providing a plated through-hole that extends through the adhesive and the substrate in the vertical directions to provide an electrical connection between the first build-up circuitry and the second build-up circuitry.

19. The method of claim 18, wherein providing the bump includes mechanically stamping a metal plate.

20. The method of claim 18, wherein attaching the flange and the bump to the substrate includes:

mounting the adhesive that is non-solidified on the flange, including aligning the bump with an opening of the adhesive;

mounting the substrate on the adhesive, including aligning the bump with the aperture of the substrate wherein the adhesive is sandwiched between the flange and the substrate; then flowing the adhesive into a gap located in the aperture between the bump and the substrate; and solidifying the adhesive.

21. The method of claim 20, wherein:

flowing the adhesive into the gap includes applying heat to melt the adhesive, and moving the flange and the substrate towards one another, thereby moving the bump in the second vertical direction in the aperture and applying pressure to the molten adhesive between the flange and the substrate, wherein the pressure forces the molten adhesive to flow in the second vertical direction into the gap located in the aperture between the bump and the substrate; and solidifying the adhesive includes applying heat to solidify the molten adhesive, thereby mechanically attaching the bump and the flange to the substrate.

22. The method of claim 20, wherein:

providing the adhesive includes providing a prepreg with uncured epoxy;

flowing the adhesive includes melting the uncured epoxy and compressing the uncured epoxy between the flange and the substrate; and solidifying the adhesive includes curing the uncured epoxy.

23. The method of claim 20, wherein mounting the substrate on the adhesive includes mounting a laminated structure that includes the substrate and a conductive layer on the adhesive such that the substrate contacts and is sandwiched between the conductive layer and the adhesive, the conductive layer is spaced from the adhesive and the aperture extends through the conductive layer and the substrate.

24. The method of claim 23, wherein flowing the adhesive includes filling the gap with the adhesive and forcing the adhesive beyond the bump and the conductive layer in the second vertical direction such that the adhesive contacts surfaces of the bump and the conductive layer that face in the second vertical direction.

25. The method of claim 23, wherein providing the first build-up circuitry and the second build-up circuitry includes:

providing a first dielectric layer on the semiconductor device and the flange that extends from the semiconductor device and the flange in the first vertical direction and includes a first via opening that is aligned with the contact pad;

providing a second dielectric layer that extends beyond the bump, the adhesive and the conductive layer in the second vertical direction;

providing a first conductive trace on the first dielectric layer that extends from the first dielectric layer in the first vertical direction, extends laterally on the first dielectric layer and extends through the first via opening in the second vertical direction to the contact pad, thereby electrically connecting the semiconductor device to the first conductive trace; and providing a second conductive trace on the second dielectric layer that extends from the second dielectric layer in the second vertical direction and extends laterally on the second dielectric layer.

26. The method of claim 25, wherein providing the first conductive trace and the second conductive trace includes:

depositing a first plated layer on the first dielectric layer that extends through the first via opening to the contact pad;
depositing a second plated layer on the second dielectric layer;
removing selected portions of the first plated layer to define the first conductive trace; and
removing selected portions of the second plated layer to define the second conductive trace.

27. The method of claim 26, comprising simultaneously depositing the first dielectric layer and the second dielectric layer and then simultaneously depositing the first plated layer and the second plated layer.

28. The method of claim 25, wherein providing the first dielectric layer, the second dielectric layer, the first conductive trace, the second conductive trace and the plated through-hole includes:
forming a through-hole that extends through the adhesive and the substrate in the vertical directions; then
depositing a connecting layer on an inner sidewall of the through-hole;
depositing an inner plated layer on the bump and flange in the first vertical direction and on the bump, the adhesive and the conductive layer in the second vertical direction; then
removing selected portions of the flange and the inner plated layer in the first vertical direction to define a first inner pad such that the first inner pad is adjacent to the connecting layer and spaced from the flange;
removing selected portions of the conductive layer and the inner plated layer in the second vertical direction to define a base and a second inner pad wherein the base is adjacent to the bump, extends from and covers the bump in the second vertical direction and extends laterally from the bump, includes a selected portion of the conductive layer that is adjacent to the aperture and spaced from the bump and includes a selected portion of the inner plated layer that is adjacent to the bump, the adhesive and the conductive layer, and the second inner pad is adjacent to the connecting layer and spaced from the bump and the base, extends from the substrate in the second vertical direction, includes a selected portion of the conductive layer that is spaced from the aperture and the bump and includes a selected portion of the inner plated layer that is adjacent to the conductive layer and spaced from the bump and the adhesive; then
depositing the first dielectric layer on the semiconductor device, the flange and the first inner pad;
depositing the second dielectric layer on the base and the second inner pad; then
forming the first via opening and an additional first via opening in the first dielectric layer, wherein the additional first via opening is aligned with and exposes the first inner pad;
forming a second via opening in the second dielectric layer that is aligned with and exposes the second inner pad; then
depositing a first plated layer on the first dielectric layer that extends through the first via opening to the contact pad and extends through the additional first via opening to the first inner pad;
depositing a second plated layer on the second dielectric layer that extends through the second via opening to the second inner pad; then
removing selected portions of the first plated layer to define the first conductive trace; and
removing selected portions of the second plated layer to define the second conductive trace.

29. The method of claim 25, wherein providing the first dielectric layer, the second dielectric layer, the first conductive trace, the second conductive trace and the plated through-hole includes:
depositing the first dielectric layer on the semiconductor device and the flange;
depositing the second dielectric layer on the bump, the adhesive and the conductive layer; then
forming the first via opening in the first dielectric layer;
depositing a first plated layer on the first dielectric layer that extends through the first via opening to the contact pad;
depositing a second plated layer on the second dielectric layer;
removing selected portions of the first plated layer to define the first conductive trace;
removing selected portions of the second plated layer to define the second conductive trace;
forming a through-hole that extends through the adhesive, the substrate, the first dielectric layer and the second dielectric layer in the vertical directions; and
depositing a connecting layer on an inner sidewall of the through-hole to provide an electrical connection between the first conductive trace and the second conductive trace.

30. The method of claim 25, comprising:
forming an additional first via opening that extends through the first dielectric layer and is aligned with and exposes the flange; and then
providing the first conductive trace that extends through the additional first via opening in the second vertical direction, thereby electrically connecting the flange to the first conductive trace.

31. The method of claim 25, comprising:
forming a second via opening that extends through the second dielectric layer and is aligned with the bump; and then
providing the second conductive trace that extends through the second via opening in the first vertical direction, thereby electrically connecting the bump to the second conductive trace.

32. The method of claim 18, comprising providing the plated through-hole during providing the first build-up circuitry and the second build-up circuitry or before mounting the semiconductor device and after attaching the flange and the bump to the substrate.

33. The method of claim 18, wherein providing the plated through-hole includes:
forming a through-hole that extends through the adhesive and the substrate in the vertical directions; and then
depositing a connecting layer on an inner sidewall of the through-hole.

34. A method of making a thermally enhanced stackable semiconductor assembly, comprising:
providing a bump, a flange, an adhesive and a laminated structure, wherein
the bump defines a cavity that faces in a first vertical direction, is adjacent to and integral with the flange and extends vertically from the flange in a second vertical direction opposite the first vertical direction and the cavity is covered by the bump in the second vertical direction,
the flange extends laterally from the bump in lateral directions orthogonal to the vertical directions, the adhesive includes an opening that extends through the adhesive, and the laminated structure includes a conductive layer and a substrate, and an aperture extends through the laminated structure;

mounting the adhesive on the flange, including inserting the bump into the opening;

mounting the laminated structure on the adhesive, including inserting the bump into the aperture, wherein the substrate contacts and is sandwiched between the conductive layer and the adhesive, the conductive layer is spaced from the adhesive and the adhesive contacts and is sandwiched between the flange and the substrate and is non-solidified; then applying heat to melt the adhesive;

moving the flange and the laminated structure towards one another, thereby moving the bump in the second vertical direction in the aperture and applying pressure to the molten adhesive between the flange and the laminated structure, wherein the pressure forces the molten adhesive to flow in the second vertical direction into a gap located in the aperture between the bump and the laminated structure;

applying heat to solidify the molten adhesive, thereby mechanically attaching the bump and the flange to the conductive layer and the substrate; then grinding the bump, the adhesive and the conductive layer such that the bump, the adhesive and the conductive layer are laterally aligned with one another at a lateral surface that faces in the second vertical direction; then mounting a semiconductor device that includes a contact pad on the bump using a die attach, thereby mechanically attaching and thermally connecting the semiconductor device to the bump, wherein the semiconductor device extends into the cavity and the bump provides a recessed die paddle for the semiconductor device; then depositing a first dielectric layer on the semiconductor device and the flange that extends from the semiconductor device and the flange in the first vertical direction and extends into and fills the remaining space in the cavity;

depositing a second dielectric layer on the bump, the adhesive and the conductive layer that extends from the bump, the adhesive and the conductive layer in the second vertical direction; then forming a first via opening that extends through the first dielectric layer and is aligned with and exposes the contact pad;

depositing a first plated layer on the first dielectric layer and removing selected portions of the first plated layer in a pattern defined by a first etch mask, wherein a first conductive trace includes a selected portion of the first plated layer that extends from the first dielectric layer in the first vertical direction and extends laterally on the first dielectric layer and extends through the first via opening in the second vertical direction to the contact pad, thereby electrically connecting the semiconductor device to the first conductive trace;

depositing a second plated layer on the second dielectric layer and removing selected portions of the second plated layer in a pattern defined by a second etch mask, wherein a second conductive trace includes a selected portion of the second plated layer that extends from the second dielectric layer in the second vertical direction and extends laterally on the second dielectric layer;

providing a first build-up circuitry that includes the first dielectric layer and the first conductive trace and a second build-up circuitry that includes the second dielectric layer and the second conductive trace; forming a through-hole that extends through the adhesive, the substrate, the first dielectric layer and the second dielectric layer in the vertical directions; and depositing a connecting layer on an inner sidewall of the through-hole, wherein a plated through-hole includes the through-hole and the connecting layer that provides an electrical connection between the first conductive trace and the second conductive trace.

35. The method of claim 34, wherein providing the bump includes mechanically stamping a metal plate, thereby forming the bump in the metal plate and the cavity in the bump, wherein the bump is a stamped portion of the metal plate and the flange is an unstamped portion of the metal plate.

36. The method of claim 34, wherein:
providing the adhesive includes providing a prepreg with uncured epoxy;
flowing the adhesive includes melting the uncured epoxy and compressing the uncured epoxy between the flange and the substrate; and
solidifying the adhesive includes curing the uncured epoxy.

37. The method of claim 34, wherein flowing the adhesive includes filling the gap with the adhesive and forcing the adhesive beyond the bump and the conductive layer in the second vertical direction such that the adhesive contacts surfaces of the bump and the conductive layer that face in the second vertical direction.

38. The method of claim 34, comprising simultaneously depositing the plated layers using electroless plating and electrolytic plating.

39. The method of claim 34, comprising:
forming an additional first via opening that extends through the first dielectric layer and is aligned with and exposes the flange; and then
providing the first conductive trace with a selected portion of the first plated layer that extends through the additional first via opening in the second vertical direction to the flange, thereby electrically connecting the flange to the first conductive trace.

40. The method of claim 34, comprising:
forming an additional first via opening that extends through the first dielectric layer and is aligned with and exposes the flange; and then
providing an additional first conductive trace that includes a selected portion of the first plated layer that extends from the first dielectric layer in the first vertical direction and extends laterally on the first dielectric layer and extends through the additional first via opening in the second vertical direction to the flange, thereby electrically connecting the flange to the additional first conductive trace.

41. The method of claim 34, comprising:
forming a second via opening that extends through the second dielectric layer and is aligned with the bump; and then
providing the second conductive trace with a selected portion of the second plated layer that extends through the second via opening in the first vertical direction, thereby electrically connecting the bump to the second conductive trace.

42. The method of claim 34, comprising:
forming a second via opening that extends through the second dielectric layer and is aligned with the bump; and then
providing an additional second conductive trace that includes a selected portion of the second plated layer that extends from the second dielectric layer in the second vertical direction and extends laterally on the second dielectric layer and extends through the second via opening in the first vertical direction, thereby electrically connecting the bump to the additional second conductive trace.

43. The method of claim 34, comprising:

depositing a third dielectric layer on the first dielectric layer and the first conductive trace that extends from the first dielectric layer and the first conductive trace in the first vertical direction and is spaced from the semiconductor device, the flange and the cavity; then forming a third via opening that extends through the third dielectric layer and is aligned with and exposes the first conductive trace; and then forming a third conductive trace that extends from the third dielectric layer in the first vertical direction and extends laterally on the third dielectric layer and extends through the third via opening in the second vertical direction to the first conductive trace, thereby electrically connecting the first conductive trace to the third conductive trace.

44. The method of claim 34, comprising:

depositing a fourth dielectric layer on the second dielectric layer and the second conductive trace that extends from the second dielectric layer and the second conductive trace in the second vertical direction; then forming a fourth via opening that extends through the fourth dielectric layer and is aligned with and exposes the second conductive trace; and then forming a fourth conductive trace that extends from the fourth dielectric layer in the second vertical direction and extends laterally on the fourth dielectric layer and extends through the fourth via opening in the first vertical direction to the second conductive trace, thereby electrically connecting the second conductive trace to the fourth conductive trace.

* * * * *